(12) United States Patent
Betsui et al.

(10) Patent No.: US 8,091,061 B2
(45) Date of Patent: Jan. 3, 2012

(54) MICROCOMPUTER HAVING MEMORY INTERFACE CIRCUITS AND MEMORY DEVICES ON A MODULE BOARD

(75) Inventors: Takafumi Betsui, Tokyo (JP); Naoto Taoka, Tokyo (JP); Motoo Suwa, Tokyo (JP); Shigezumi Matsui, Tokyo (JP); Norihiko Sugita, Tokyo (JP); Yoshiharu Fukushima, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 1403 days.

(21) Appl. No.: 11/616,966

(22) Filed: Dec. 28, 2006

(65) Prior Publication Data

US 2007/0192559 A1     Aug. 16, 2007

(30) Foreign Application Priority Data

Feb. 10, 2006  (JP) ................................. 2006-033513

(51) Int. Cl.
  *G06F 17/50*    (2006.01)
(52) U.S. Cl. ......................... 716/132; 716/122; 716/137
(58) Field of Classification Search .................. 716/122, 716/132, 137; 711/103, 167; 712/33, 35, 712/41, 43, 200
See application file for complete search history.

(56) References Cited

U.S. PATENT DOCUMENTS

| | | | |
|---|---|---|---|
| 5,553,244 A * | 9/1996 | Norcross et al. | 710/100 |
| 7,283,946 B2 * | 10/2007 | Hiquchi et al. | 703/21 |
| 2004/0003167 A1 * | 1/2004 | Kimura et al. | 711/103 |
| 2006/0224859 A1 * | 10/2006 | Ohsuga et al. | 712/200 |

OTHER PUBLICATIONS

JEDEC Standard, DDR2 SDRAM Specification JESD79-2B(Revision of JESD79-2A), Jan. 2005, JEDEC Solid State Technology Association.

* cited by examiner

Primary Examiner — Vuthe Siek
(74) Attorney, Agent, or Firm — Mattingly & Malur, PC

(57) ABSTRACT

A microcomputer provided on a rectangular semiconductor board has memory interface circuits. The memory interface circuits are separately disposed in such positions as to extend along the peripheries of the semiconductor board on both sides from one corner as a reference position. In this case, limitations to size reduction imposed on the semiconductor board can be reduced compared with a semiconductor board having memory interface circuits only on one side. Respective partial circuits on each of the separated memory interface circuits have equal data units associated with data and data strobe signals. Thus, the microcomputer has simplified line design on a mother board and on a module board.

8 Claims, 25 Drawing Sheets

FIG. 15

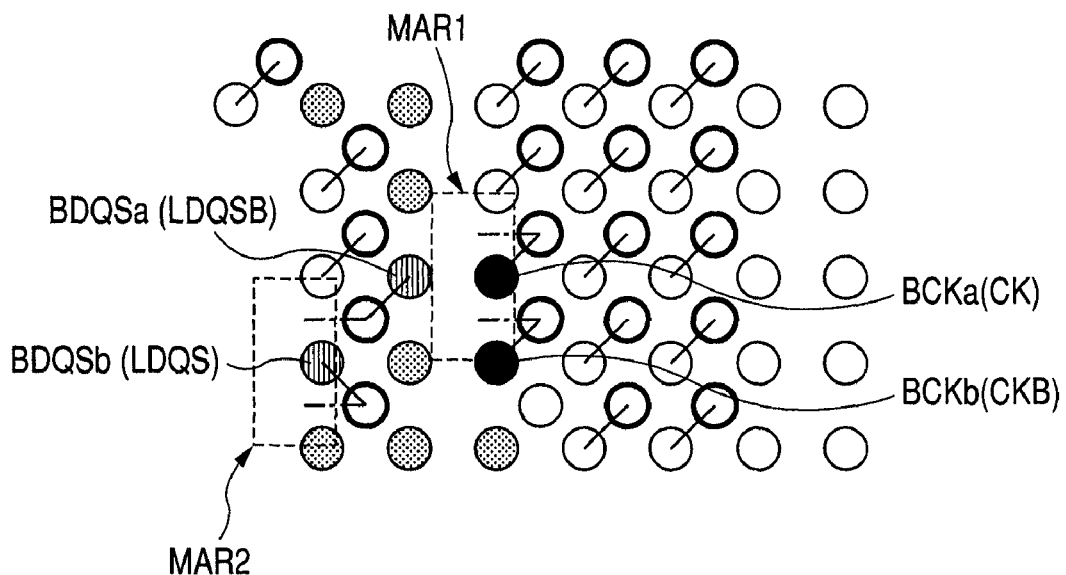

○    PIN RECEIVING LAND (COMPONENT SURFACE, GENERAL SIGNAL, EXTENSION NECESSARY)

◉    PIN RECEIVING LAND (COMPONENT SURFACE, DRAM SIGNAL, EXTENSION UNNECESSARY)

●    PIN RECEIVING LAND (COMPONENT SURFACE, DRAM CLOCK SIGNAL, TERMINAL NECESSARY)

▥    PIN RECEIVING LAND (COMPONENT SURFACE, DRAMDQS SIGNAL, TERMINAL NECESSARY)

○    PENETRATING VIA (SOLDERED SURFACE)

┆┈┆    RESISTANCE MOUNT AREA (SOLDERED SURFACE)

——    COMPONENT SURFACE LINE

—·—    SOLDERED SURFACE LINE

MICROCOMPUTER HAVING MEMORY INTERFACE CIRCUITS AND MEMORY DEVICES ON A MODULE BOARD

BACKGROUND OF THE INVENTION

1. Field of the Invention

The present invention relates to a microcomputer having memory interface circuits and a semiconductor device such as an SIP (system in package) having a microcomputer and memories on a module board. For example, the invention relates to a technique which is effectively applied to a microcomputer having memory interface circuits connectable with DDR (double data rate) 2-SDRAM (synchronous dynamic random access memory) in conformity to JEDEC STANDARD No. 79-2B.

2. Description of the Related Art

There is JEDEC STANDARD as international standards for SDRAM, which standardizes pin arrangements, pin functions, operation modes, and other specifications. For example, according to DDR2-SDRAM specified in JEDEC STANDARD No. 79-2B shown in JEDEC STANDARD, DDR2 SDRAM SPECIFICATION JESD 79-2B (Revision of JESD 79-2A), January 2005, JEDEC SOLID STATE TECHNOLOGY ASSOCIATION, data strobe signals and clock signals are differential pairs, and data and data strobe signal pin arrays are separated from command and address pin arrays. Particularly in the interface specification having the parallel data input/output bit number of 16 bits (×16 bits), the data and data strobe signal pin arrays having upper bytes are further separated from the data and data strobe signal pin arrays having lower bytes.

The inventors of the invention have examined a memory interface circuit corresponding to DDR2-SDRAM in a microcomputer containing a memory controller. With current development in the fields of operation voltage reduction, circuit element miniaturization and others, decrease in the sizes of chip and package in a microcomputer has been promoted. When the chip is made compact, the number of input/output circuit cells (I/O cells) which can be arranged around the chip is limited. For example, data and data strobe interface of a DDR2-SDRAM for data of one byte further requires a corresponding differential pair and a data mask signal of 3 bits, that is, I/O cells of 11 bits in total. When the cell width of one I/O cell is approximately 80 μm, a width of at least 880 μm is necessary for only the interface signal of one byte. When the width is almost doubled considering that power supply and GND cells are contained, 1760 μm is required. Thus, 7040 μm is needed for the interface signal of four bytes, and a width of 7 mm or larger is necessary for only the data and data strobe interface. Therefore, the data and data strobe interface cannot be disposed on one side of a square chip having 7 mm or smaller for one side. It is also considered that a rectangular chip having longer sides of 7 mm or larger is used. In this case, however, the correlation between the circuit positions and the circuit characteristics becomes closer on the chip, and the possibility of deterioration in the reliability increases. The inventors of the invention investigated the positions of the memory interface pin arrays which realize miniaturization of the microcomputer chip and package. Moreover, the inventors clarified the necessities for improvements from other viewpoints required for this miniaturization as well as the arrangement of the memory interface pin arrays when a plurality of bare chips or the like are mounted on a module board with high density. The "other viewpoints" herein include noise resistance, external attachment positions of electronic components, testability of plural sealed chips, and others which are important for high-density line arrangement.

SUMMARY OF THE INVENTION

It is an object of the invention to provide a microcomputer which has simplified line design on a mother board and on a module board.

It is another object of the invention to provide a microcomputer which has memory interface circuits easily connectable with plural types of memories having different data input/output bit numbers such as 8 bits and 16 bits.

It is still another object of the invention to improve reliability of a miniaturized semiconductor device which has a plurality of semiconductor units on a module board.

The above and other objects to be achieved by the invention and novel characteristics of the invention will be clarified from the description of this specification and the accompanying drawings.

Typical examples disclosed according to the invention are shown briefly hereinafter.

[1] <Data Memory Interface Positions>

A microcomputer (1) according to an aspect of the invention provided on a rectangular semiconductor board includes memory interface circuits (4, 5) which are disposed separately from each other in such positions as to extend along the peripheries of the semiconductor board on both sides from one corner as a reference position. In this case, limitations to size reduction imposed on the semiconductor board can be reduced compared with a semiconductor board having memory interface circuits only on one side.

Respective partial circuits of the separated memory interface circuits on both sides have the same data units associated with data and data strobe signals. In this case, the microcomputer (1) has simplified line design on a mother board and on a module board.

The data units have units (LBIF, UBIF) whose unit of the data is byte. In this case, the design of the memory interface circuits is simplified since the number of units in layout is varied according to the interface scale given to the memory interface circuits. Thus, the microcomputer (1) is easily applicable to plural types of memory having different data input/output bit numbers in specifications such as 8 bits and 16 bits. When data interface having integral multiples of 8 bits is used, the data units have the plural units disposed in series.

In a specific example according to the invention, the units have seven data input/output circuits (10), a data mask signal circuit (11), an inversion data strobe signal circuit (12), a non-inversion data strobe signal circuit (13), and a data input/output circuit (14) in this order from the corner as the reference position. This arrangement satisfies the pin arrangement of a DDR2-SDRAM in conformity with JEDEC STANDARD. More specifically, in the DDR2-SDRAM, data and data strobe signal pin arrays are separated from command and address pin arrays along the longer side of the DDR2-SDRAM. Particularly, for the interface having the parallel data input/output bit number of 16 bits (×16 bits), upper byte data and data strobe signal pin arrays are also separated from lower byte data and data strobe signal pin arrays. By disposing the longer side of the DDR2-SDRAM opposed to the data units of the microcomputer, the line routes extending from the byte data and data strobe signal pin arrays to the data units can be simplified. Accordingly, the microcomputer has simplified line design on a mother board and on a module board.

[2] <Differential Pin Positions>

In another example according to the invention, the microcomputer includes a package on which the semiconductor board is mounted. The package has a ball grid array structure for external connection pins. An external connection pin connected with the inversion data strobe signal circuit and an external connection pin connected with the non-inversion data strobe signal circuit are disposed adjacent to each other on the first round and the second round or on the third round or fourth round, respectively, from the outermost position of the ball grid array so as to constitute differential pins. In the lines on the mount board connected with the external connection pins having the ball grid array structure, the line connected with the ball electrodes on the first round from the outermost round of the ball grid array is extended to the outside as it is, and the line connected with the ball electrodes on the second round passes between the two lines connected with the ball electrodes on the first round and extends to the outside. The respective lines connected with the ball electrodes on the third and fourth rounds pass through line layers different from those of the external connection pins on the first and second rounds and similarly extend to the outside. According to the typical line structure of this type, the lines connected with the differential pins are disposed adjacent to and opposed to each other in the same line layer when the differential pins are positioned adjacent to each other on the first and second rounds or the third and fourth rounds. Thus, the cancellation of the in-phase noise elements can be easily maintained on the mount board.

[3] <Address and Command Memory Interface Positions>

In still another example according to the invention, each of the separated respective partial circuits of the microcomputer on both sides has command and address units (CAIF) associated with address signals and commands. The command and address units are disposed in series with the data units. The positions of the command and address units are closer to one corner of the semiconductor board than the positions of the data units. In this structure, when the DDR2-SDRAMs are disposed on the mount board as opposed to the respective memory interface circuits separated along the left and right peripheries of the semiconductor board, the lines for supplying commands and addresses from the microcomputer to the respective DDR2-SDRAMs extend from the corner as the reference position through an area between the DDR2-SDRAMs and reach pins of the respective DDR2-SDRAMa after branching. Accordingly, the route lengths of the command and address lines on the mount board can be easily equalized.

The structure of the command and address units is equivalent to the following structure. DDR2-SDRAMs having a pin arrangement in conformity with JEDEC STANDARD are connectable to the memory interface circuits. The memory interface circuits have an arrangement of interface functions corresponding to data pin arrays associated with data and data strobe signals and command and address pin arrays associated with address signals and commands on the longer side of the DDR2-SDRAM.

[4] <Synchronous Clock Module Pin Positions>

A semiconductor device according to an aspect of the invention includes a module board, a plurality of memory devices and a data processing device disposed on one surface of the module board, and a plurality of module pins disposed on the other surface of the module board. The module board has differential clock lines for transmitting differential clock signals outputted from the data processing device to the memory devices and a pair of module pins (BCKa, BCKb) connected with the differential clock lines as pins connected with differential terminal resistance. The pair of the module pins connected with differential terminal resistance are disposed adjacent to each other and adjacent to an area where other module pins are not provided or to module pins used exclusively for testing.

In this case, no line connected with the module pins used exclusively for testing is formed on the mount board on which the semiconductor device is mounted. Thus, when the module pins connected with differential terminal resistance are disposed adjacent to the area where other module pins are not provided or to the module pins used exclusively for testing, the differential terminal resistance can be directly and easily placed on the corresponding connection pins. Accordingly, the line routes extending from the branching point to the differential terminal resistance can be appropriately equalized and shortened to extremely small lengths.

[5] <Plural Feeding Vias to Memory Core>

A semiconductor device according to another aspect of the invention includes a module board, memory devices and a data processing device disposed on one surface of the module board, and a plurality of module pins disposed on the other surface of the module board. The module board has a core layer and build-up layers formed on the front and back surfaces of the core layer. The module pins include a first module power supply pin (Vcc-DDR) for supplying memory interface power to the data processing device, a second module power supply pin (Vdd-DRAM) for supplying core circuit power to the memory devices, a third module power supply pin (Vddq-DRAM) for supplying external output and external input/output interface power to the memory devices, and a module ground pin for supplying ground voltage to the data processing device and the memory devices, all of which are electrically separated from one another. This structure separates the power supply for the memory devices from the power supply for the data processing device such that individual tests can be easily executed. The external output and external input/output interface power supply is separated from the core power supply such that power supply noise generated by the input/output operation does not easily give influence to the core circuit. The number of vias formed in the build-up layer for one via in the core layer in a feeding route for connecting the second module power supply pin to the memory devices is larger than the number of vias in the build-up layer for one via in the core layer in a feeding route for connecting the third module power supply pin to the memory devices. This structure prevents insufficiency in current supply capability caused by the smaller conductive area of the via in the build-up layer than the conductive area of the via in the core layer when the power consumption of the core circuit in the memory device is larger than the power consumption of the external output and external input/output interface circuits. For example, when the memory device is the DDR2-SDRAM, refresh operation of dynamic-type memory cells consumes relatively large power.

The above aspect of the invention as a superordinate concept associated with the plural feeding vias to the memory core is now described. The semiconductor device according to this concept includes a module board, memory devices and a data processing device disposed on one surface of the module board, and a plurality of module pins disposed on the other surface of the module board. The module board has a core layer and build-up layers formed on the front and back surfaces of the core layer. The module pins include a module power supply pin (Vcc-DDR) for supplying power to the data processing device, and a module power supply pin (Vdd-DRAM, Vddq-DRAM) for supplying power to the memory devices as module pin separated from the module power supply pin (Vcc-DDR). The module power supply pin for supplying power to the memory devices is separated into a core power supply part and an external output and external input/output interface power supply part. The number of vias formed in the build-up layer for one via in the core layer in a feeding route for supplying the core power to the memory devices is larger than the number of vias in the build-up layer for one via in the core layer in a feeding route for supplying the external output and external input/output interface power to the memory devices.

[6] <Noise Reduction by Ground Slit>

A semiconductor device according to still another aspect of the invention includes a module board, memory devices and a data processing device disposed on one surface of the module board, and a plurality of module pins disposed on the other surface of the module board. The module board has a core layer and build-up layers formed on the front and back surfaces of the core layer. The module pins include a first module power supply pin (Vcc-DDR) for supplying memory interface power to the data processing device, a second module power supply pin (Vdd-DRAM) for supplying core circuit power to the memory devices, a third module power supply pin (Vddq-DRAM) for supplying external output and external input/output interface power to the memory devices, and a module ground pin for supplying ground voltage to the data processing device and the memory devices, all of which are electrically separated from one another. The memory devices has a first device ground pin (VSS) for inputting core circuit ground voltage used with power supplied from the second power supply module pin and a second device ground pin (VSSQ) for inputting external output and external input/output interface ground voltage used with power supplied from the third power supply module pin. The core layer and the build-up layers have a ground pattern (GPTN) connected with the module ground pin and the first and second device ground pins. The ground pattern has a slit (SLT) formed on a line segment between a pad or via connected with the first device ground pin and a pad or via connected with the second device ground pin.

In this structure, the module ground pins are electrically unified with the ground pattern of the core layer and the build-up layers without separation which is seen in the case of the power supply pins. Thus, problems such as deterioration of ESD (electrostatic discharge) resistance, deterioration of electric properties due to hindrance to the return path route, and difference in the ground levels are not caused. There is a possibility of noise entrance between the different ground pins, but the slit elongates the routes providing electrical continuity between different ground vias and pads on the ground pattern. That is, the lengths of routes providing electrical continuity between different ground pins are increased on the plane of the ground pattern. As a result, AC noise is easily introduced to the route providing electrical continuity in the longitudinal direction to a bypass capacitor provided on the mount board. Since current flows relatively easily, entrance of ground noise to different ground pins can be reduced or mitigated.

The slit (STL) may be formed on the periphery of a ground plane (55) used as a guard for a signal line. More specifically, the slit is formed between the pad or via connected with the first device ground pin or the pad or via connected with the second device ground pin and the periphery of the ground plane opposed to a signal line. Return current flows through the periphery of the ground plane used as the guard for the signal line in parallel with the signal line. The slit secures a return path on the periphery of the ground plane adjacent to the signal line, and prevents entrance of current flowing through the return path to the ground pin of the device as noise.

[7] <Positions of Memory Device and Data Processing Device>

A semiconductor device according to still another aspect of the invention includes a module board, a plurality of memory devices and a data processing device disposed on one surface of the module board, and a plurality of module pins disposed on the other surface of the module board. The data processing device has memory interface circuits each of which is separately disposed in such positions as to extend along the peripheries on both sides from one corner as a reference position. The memory devices are DDR2-SDRAMs having a pin arrangement in conformity with JEDEC STANDARD. The longer sides of the DDR2-SDRAMs are opposed to the peripheries of the data processing device having the memory interface circuits. The DDR2-SDRAMs have a pin arrangement in which command and address pin arrays associated with address signals and commands and data pin arrays associated with data and data strobe signals extend along the longer side from one shorter side as a reference position close to the corner as the reference position such that the command and address pin arrays are separated from the data pin arrays. Main command and address lines for connecting the command and address pin arrays with corresponding pins of the DDR2-SDRAMs have routes extending from the corner as the reference position through an area between the DDR2-SDRAMs and reaching the pins of the respective DDR2-SDRAMs after branching.

Accordingly, the data and data strobe signal line design on the module board is simplified, and the route lengths of the command and address lines are easily equalized.

In a specific example of the invention, the module board has differential clock lines for transmitting differential clock signals outputted from the data processing device to the memory devices, and the differential clock lines are disposed along the routes of the main command and address lines. Since the clock signals specify the timing for receiving the command and address signals, it is preferable to dispose the clock signals and the command and address signals in parallel for matched timing, i.e., to provide equal topology.

In another example according to the invention, data and data strobe signal lines for connecting pins of the data pin arrays of the DDR2-SDRAMs with corresponding pins of the data processing device have lengths equal to the lengths of corresponding data strobe signal lines and data lines. Some of the data and data strobe signal lines have folded parts on the same routes such that the lengths of the data and data strobe signal lines can be equalized. By providing the folded parts of the routes, the route lengths of the data and data strobe signal lines can be easily equalized.

In still another example according to the invention, command and address lines for connecting pins of the command and address pin arrays of the DDR2-SDRAMs with corresponding pins of the data processing device have equal lengths. Some different lines of the command and address lines connected to the same DDR2-SDRAM have reverse-direction routes whose transmission direction is reversed such that the route lengths can be equalized. By providing the routes extending in the opposite directions, the route lengths of the command and address lines can be easily equalized.

Typical advantages provided according to the invention are briefly discussed hereinafter.

The microcomputer provided according to the invention has simplified line design on the mother board and on the module board (semiconductor package board).

The microcomputer provided according to the invention has the memory interface circuits easily applicable to plural types of memory having different data input/output bit numbers such as 8 bits and 16 bits.

The size of the semiconductor device having a plurality of semiconductor devices on the module board can be reduced with improved reliability in view of feeding capability, ground noise reduction, equalized line lengths, and other points.

BRIEF DESCRIPTION OF THE DRAWINGS

FIG. 15 is a plan view showing the detailed areas of a pair of ball electrodes connected with differential terminal resistance and disposed in the vicinity of clock pins CK and CKB of the SDRAM and a pair of ball electrodes connected with differential terminal resistance and disposed in the vicinity of differential data strobe pins.

DESCRIPTION OF THE PREFERRED EMBODIMENTS

<Memory Interface Circuit Positions on Microcomputer>

Figure 1:
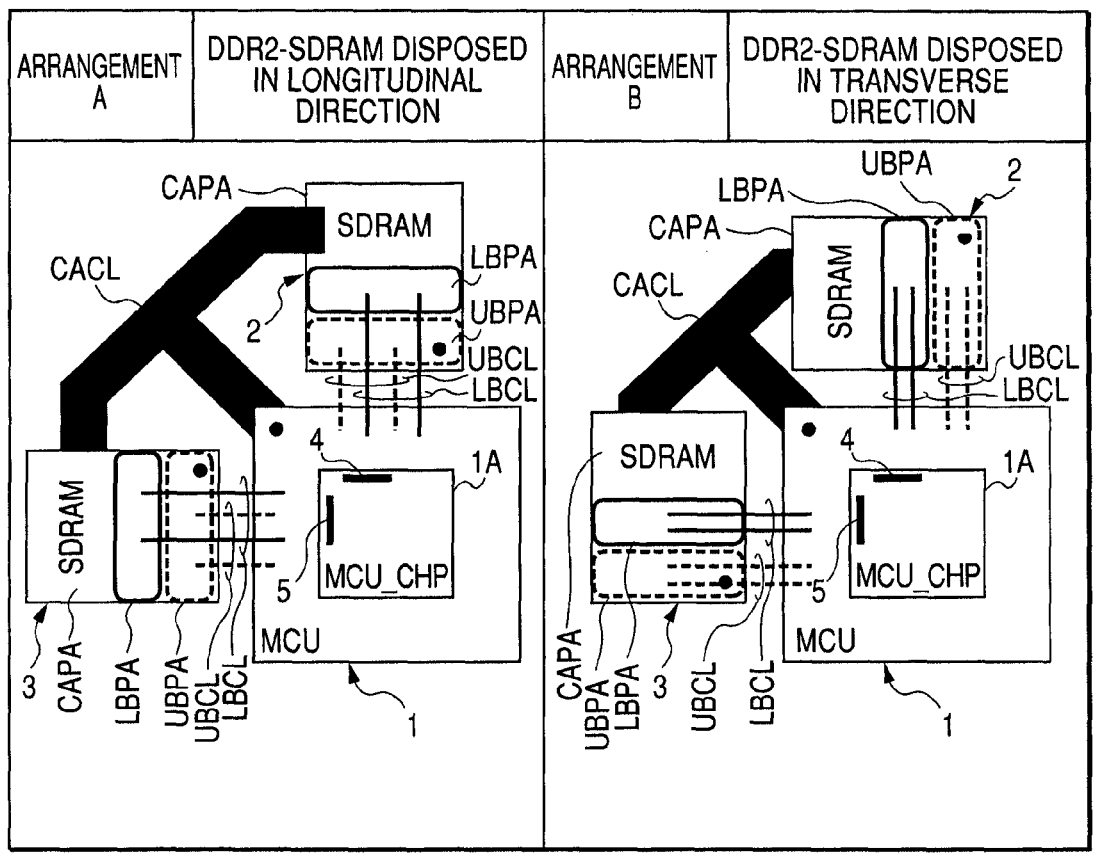
FIG. 1 illustrates an example of memory interfaces in a microcomputer according to the invention.
Figure 2:
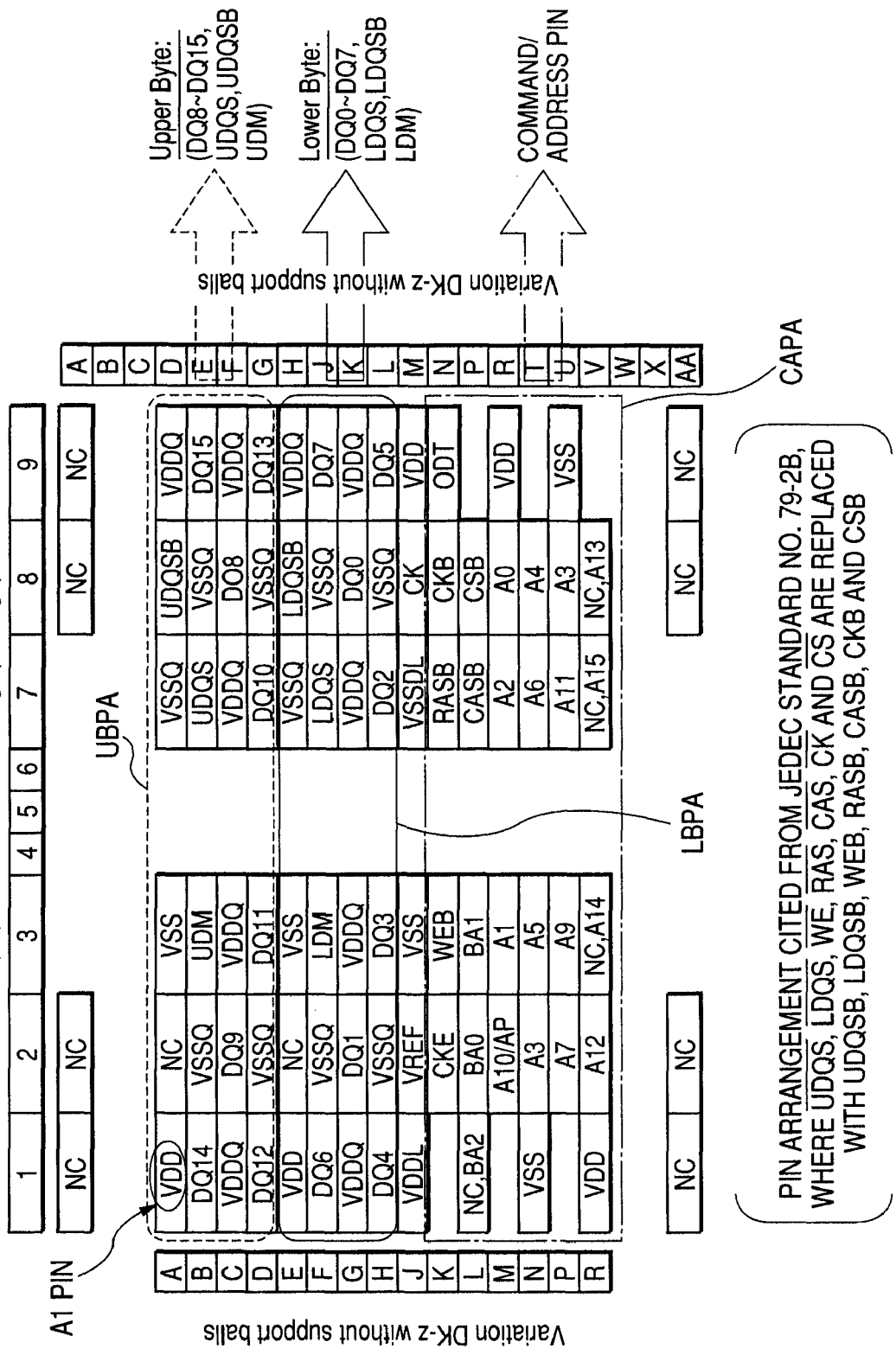
FIG. 2 illustrates an example of a pin arrangement of a DDR2-SDRAM for performing input and output of ×16 data.

FIG. 1 illustrates an example of memory interfaces in a microcomputer according to the invention. The figure shows a microcomputer (MCU) 1, and DDR2-SDRAMs 2 and 3. The microcomputer 1 particularly includes a microcomputer chip (MCU_CHP) 1A. In this example, the microcomputer 1 and the DDR2-SDRAMs (hereinafter also abbreviated as SDRAMs) 2 and 3 are separately packaged, and mounted on a printed circuit board (PCB). Each of the SDRAMs 2 and 3 has a BGA (ball grid array) package, and the pin arrangement of this package is specified in JEDEC STANDARD shown above. For example, the pin arrangement when the parallel data input/output bit number is ×16 bits is shown in FIG. 2. According to this pin arrangement, data and data strobe signal pin arrays are separated from command and address pin arrays CAPA, and the data and data strobe signal pin arrays are further divided into upper byte unit pin arrays UBPA and lower byte unit pin arrays LBPA. These pin arrays of the upper byte unit pin arrays UBPA, the lower byte unit pin arrays LBPA, and the command and address pin arrays CAPA are disposed in this order along the longer side from a reference position of A1 pin on the shorter side according to the above standard. FIG. 2 shows DQ0 through DQ15 as data input/output pins, LDQS and LDQSB as differential data strobe pins for the lower byte data of DQ0 through DQ7, UDQS and UDQSB as differential data strobe pins for the upper byte data of DQ8 through DQ15, A0 through A15 as address input pins, and BA0 through BA2 as bank address input pins. RASB, CASB, and WEB are command input pins. CSB is a chip selection pin. CK and CKB are differential clock input pins. CKE is a clock enable pin. LDM is a data mask pin for the lower byte data of DQ0 through DQ7. UDM is a data mask pin for the upper byte data of DQ8 through DQ15. VDD and VDDQ are memory power supply pins. VSS and VSSQ are ground pins. VDDQ and VSSQ are exclusively used for power supply and grounding of the data input/output circuit and the data strobe signal input/output circuit (external output and external input/output circuits) of the DDR2-SDRAM. VDD and VSS are external pins for power supply and grounding of other circuits (core circuits) of the DDR2-SDRAM. In this example, the voltage levels of the VDDQ and VDD are equivalent such as 1.8V, and the voltage levels of VSSQ and VSS are also equivalent such as 0V. VDDL and VSSDL are power supply and ground voltage exclusively used for DLL (delay locked loop) circuit used for producing internal timing. VREF is an input pin for reference voltage, and a judgment level for the external interface in SSTL (stub series terminated transceiver logic) is given to VREF. NC is a non-connection pin.

In each of arrangements A and B in FIG. 1, the microcomputer chip (semiconductor chip) 1A has memory interface circuits 4 and 5 for the SDRAMs 2 and 3, respectively, separately disposed along the peripheries on both sides from one corner as a reference position. The memory interface circuits 4 and 5 are separately positioned for the following reason. The data and data strobe interface of a SDRAM for one byte further requires I/O cells of a corresponding differential pair of data strobe signals and a data mask signal of 3 bits, and thus I/O cells of 11 bits in total. When the cell width of one I/O cell is approximately 80 μm, at least a width of 880 μm is needed for only the interface signal of one byte. When the width is almost doubled considering that power supply and GND cells are contained, 1760 μm is required. Thus, 7040 μm is needed for the interface signal of four bytes, and a width of 7 mm or larger is necessary for only the data and data strobe interface. Therefore, the data and data strobe interface cannot be disposed on one side of a square chip having 7 mm or smaller for one side. It is also considered that a rectangular chip having longer sides of 7 mm or larger is used. In this case, however, the correlation between the circuit positions and the circuit characteristics becomes closer on the chip, and the possibility of deterioration in the reliability increases. For overcoming this drawback, the memory interface circuits 4 and 5 are separately positioned so that the microcomputer chip 1A and the packages can be miniaturized without deterioration of the reliability of the microcomputer chip 1A.

FIG. 1 shows the example (arrangement A) where the shorter sides of the SDRAMs 2 and 3 are opposed to the microcomputer and the example (arrangement B) where the longer sides of the SDRAMs 2 and 3 are opposed to the microcomputer as the connection examples between the SDRAMs 2 and 3 and the microcomputer chip 1A. Considering that the pin pitch of the BGA package is equal in both the longitudinal and transverse directions, the density of the lines (PCB lines) for connecting the microcomputer 1 and the SDRAMs 2 and 3 is more easily reduced when the longer sides of the SDRAMs 2 and 3 are opposed to the microcomputer 1A. Thus, the arrangement B is more preferable in this aspect. Moreover, considering that the upper byte unit pin arrays UBPA are separated from the lower byte unit pin arrays LBPA, the PCB lines are more easily regulated per byte unit when the arrangement B is used. Furthermore, in the arrangement B, the data and data strobe signal circuits of the memory interfaces 4 and 5 in the microcomputer chip 1A can be regulated per byte unit, and thus the circuit design can be simplified. Accordingly, the arrangement B is more preferable for these reasons. The command and address pin arrays CAPA separated from the data and data strobe signal pin arrays are disposed near the corner of the microcomputer 1, and these pins are connected with the microcomputer 1. The PCB lines may have line topology in which a signal line extended from the microcomputer 1 is branched into two parts and the branched parts have the same line length (hereinafter, the line topology where a signal line is branched into two parts and the branched left and right parts have the same line length is referred to as 'T-shaped topology'). In this aspect, the arrangement B is similarly preferable since the PCB line length is shorter in the arrangement B. In FIG. 1, UBCL as upper byte unit PCB line, LBCL as lower byte unit PCB line, and CACL as command and address PCB line are shown.

Figure 3:
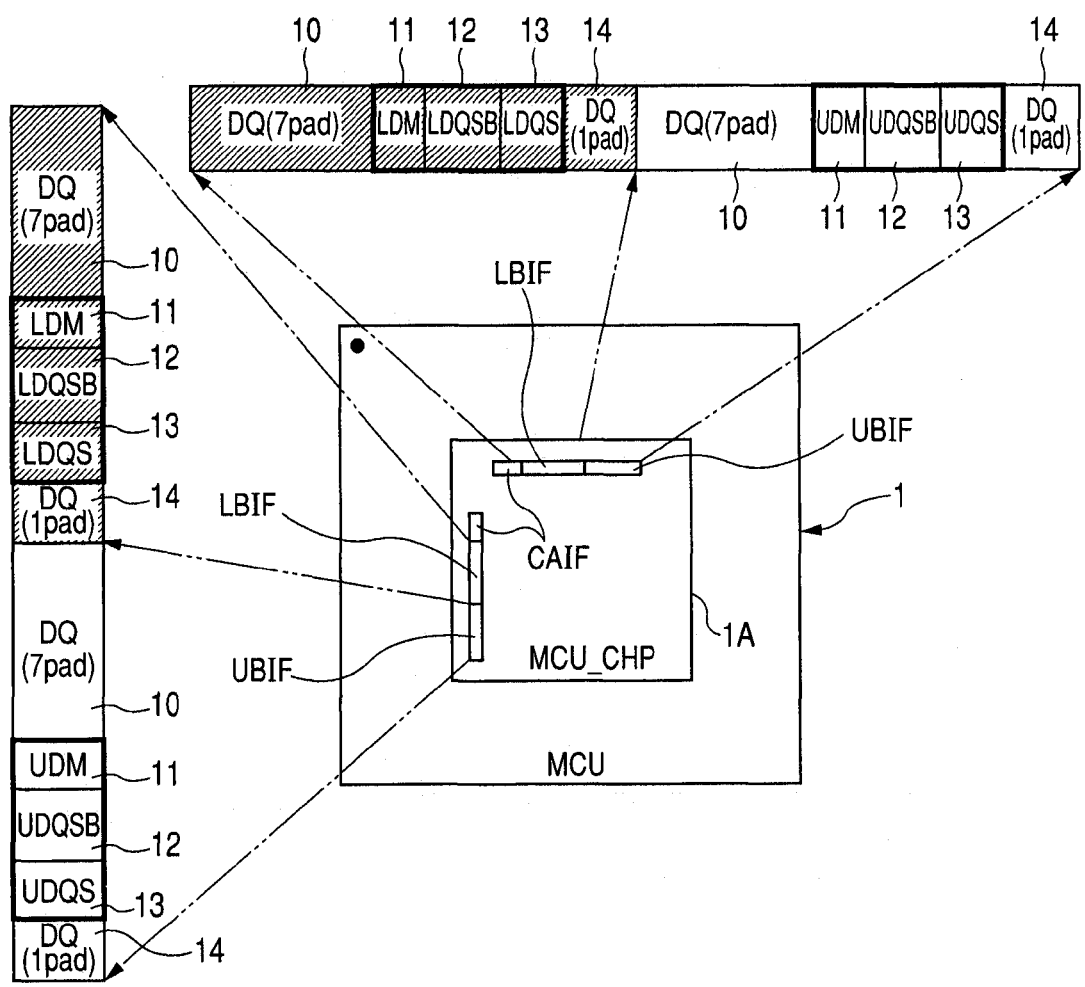
FIG. 3 is a plan view showing an example of interface functions of data units in a memory interface circuit of the microcomputer.

FIG. 3 illustrates an example of the interface functions of the data units contained in the memory interface circuits 4 and 5 of the microcomputer 1. Each of the memory interface circuits 4 and 5 separated on the microcomputer 1 has a command and address interface unit CAIF and two data units at the positions in correspondence with the positions of the command and address pin arrays CAPA, the lower byte unit pin arrays LBPA, and the upper byte unit pin arrays UBPA along the longer sides of the SDRAMs 2 and 3. One of the data units is upper data interface unit UBIF, and the other data unit is lower data interface unit LBIF. The command and address interface unit CAIF has an address output and command input/output interface circuit connected with the command and address pin arrays CAPA and others. Each of the data units LBIF and UBIF has bytes as units for inputting and outputting data, and their circuit structures are the same regardless of whether the data units are for lower bytes or upper bytes except that the allocations of the data and strobe signals are different. According to the pin arrangement of DDR2-SDRAM in conformity with the JEDEC STANDARD, the data and data strobe signal pin arrays UBPA and LBPA are separated from the command and address pin arrays CAPA in DDR2-SDRAM along its longer side. Particularly in the interface specification having the parallel data input/output bit number of 16 bits (×16 bits), the upper byte data and data strobe signal pin arrays UBPA are separated from the lower byte data and data strobe signal pin arrays LBPA. By disposing the longer side of the DDR2-SDRAM opposed to the data units UBIF and LBIF of the microcomputer 1, the line routes extending from the byte data and data strobe signal pin arrays UBPA and LBPA to the data units UBIF and LBIF can be simplified. Thus, the line design on the PCB and on the module board (semiconductor package board) can be securely simplified.

As shown in FIG. 3, each of the data units LBIF and UBIF has seven data input/output circuits 10, a data mask signal circuit 11, an inversion data strobe signal circuit 12, a non-inversion data strobe signal circuit 13, and a data input/output circuit 14 in this order from one corner of the microcomputer chip 1A. Thus, the pad electrodes in the microcomputer chip are disposed at these positions.

Figure 4:
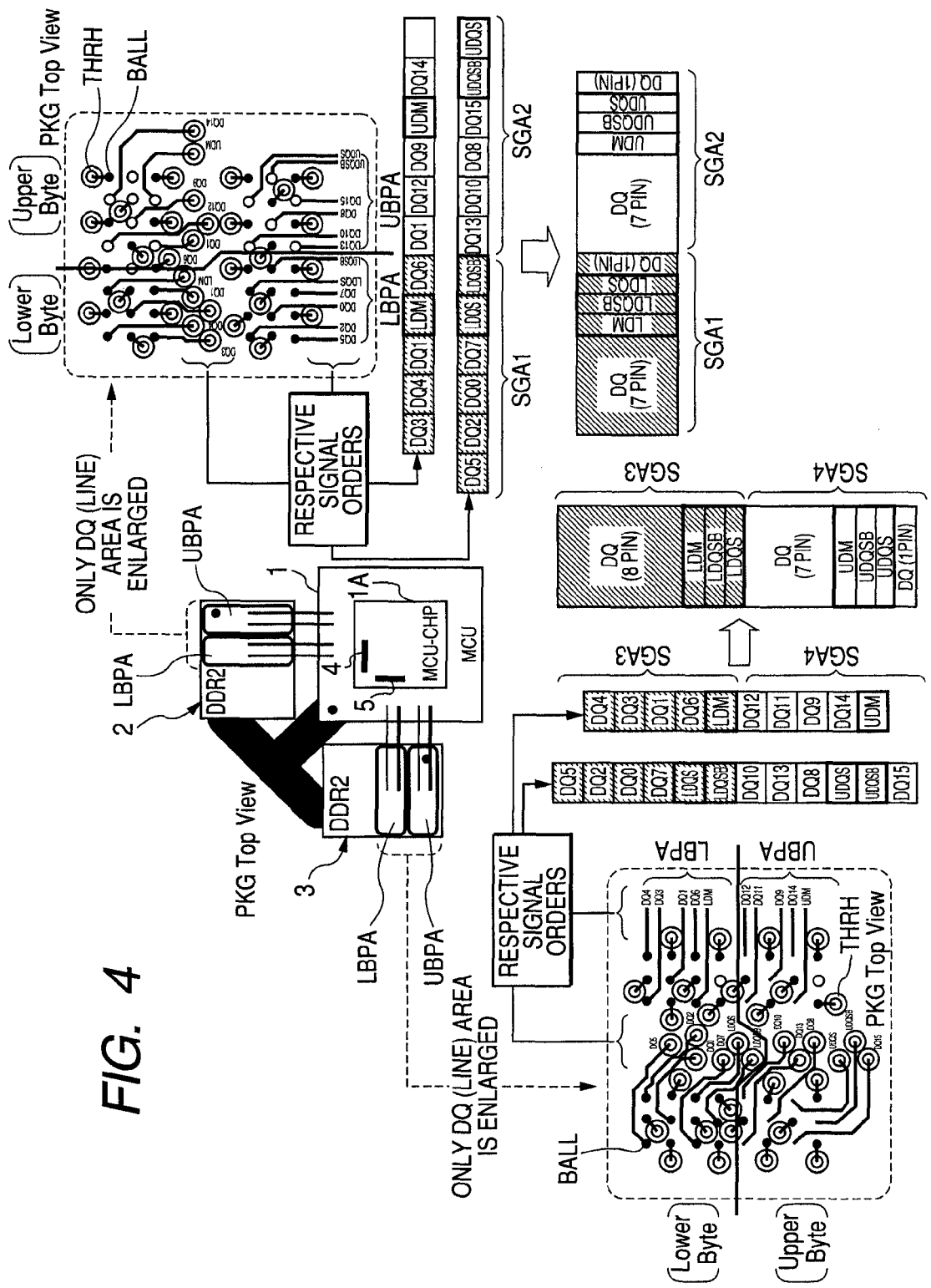
FIG. 4 shows an arrangement of interface functions in data units LBIF and UBIF shown in FIG. 3, explaining why this arrangement is adopted.

FIG. 4 shows the reasons why the interface function arrangement of the data units LBIF and UBIF shown in FIG. 3 is adopted. FIG. 4 illustrates an example of the line extension routes from ball electrodes (BALL) of the SDRAMs 2 and 3 to the PCB. In this example, a single line passes between the balls, and the line layers on the PCB are connected using through holes (THRH). Thus, a low-cost PCB is used. The signal arrangement of the extension lines in this case is arrangement SGA1 for the lower byte data and data strobe signal pin arrays LBPA of the SDRAM 2, and arrangement SGA2 for the upper byte data and data strobe signal pin arrays UBPA of the SDRAM 2. Arrangement SGA3 is employed for the lower byte data and data strobe signal pin arrays LBPA of SDRAM 3, and arrangement SGA4 for the upper byte data and data strobe signal pin arrays UBPA of SDRAM 3. The signal arrangements SGA1, SAG2, and SGA4 are equivalent, while the signal arrangement SGA3 is different from those arrangements only in the arrangement of one bit data. Thus, the interface function arrangements in the data units LBIF and UBIF shown in FIG. 3 are matched with the signal arrangements SGA1, SGA2 and SGA4. That is, the data and data strobe signal circuits of the memory interface circuits 4 and 5 in the microcomputer chip 1A have the same structure by byte unit so that the circuit design can be simplified. This method eliminates the necessity for changing the structure of a part of the circuit units to optimize the data pin arrangement of only one bit for the PCB lines.

Figure 5:
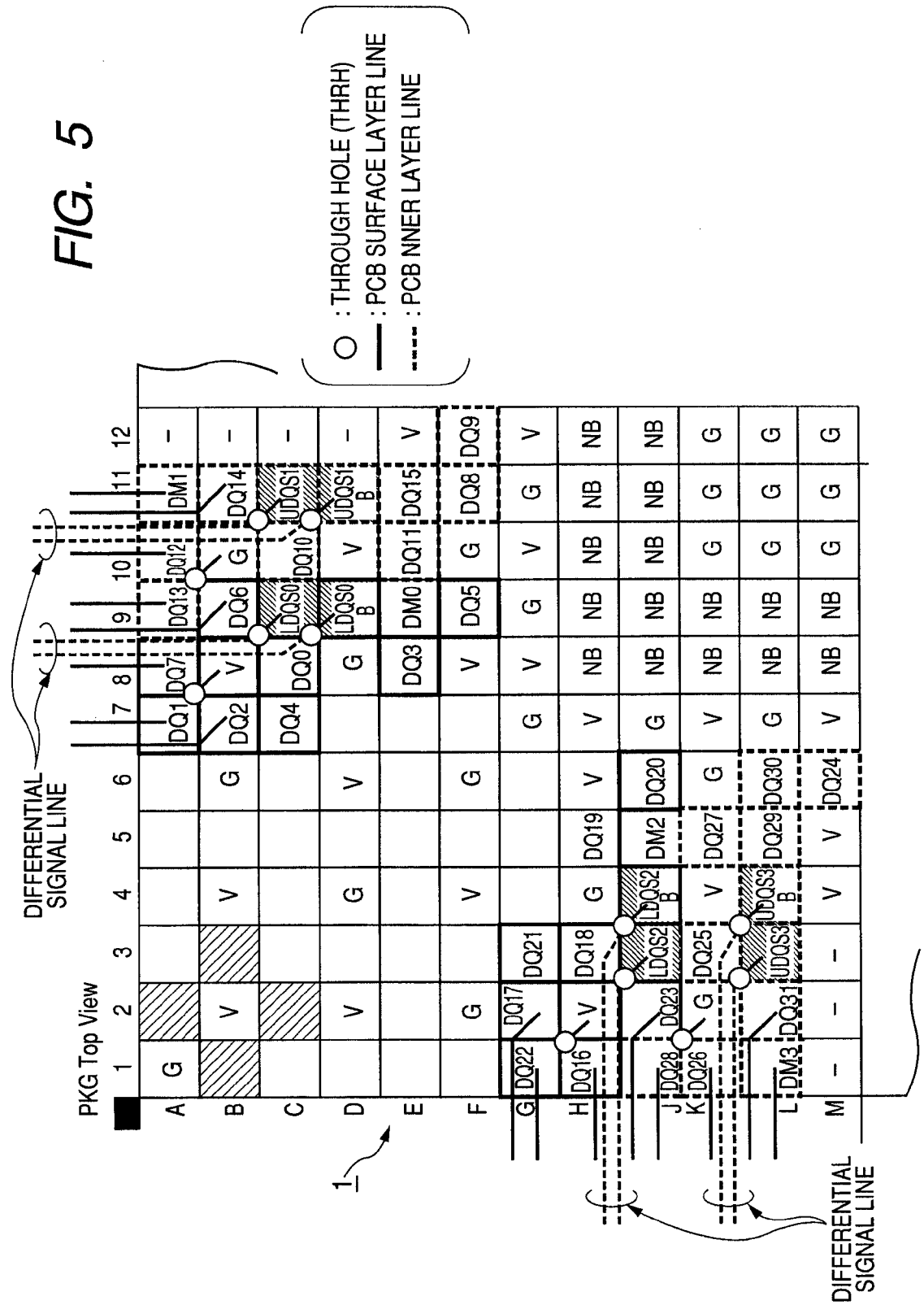
FIG. 5 is a plan view showing an example of a ball electrode arrangement in the microcomputer.

FIG. 5 illustrates an example of the positions of ball electrodes on the microcomputer 1. In reality, the ball electrodes are disposed in matrix with a predetermined pitch in the longitudinal and transverse directions. In this figure, however, the ball electrodes are shown as square frames so as to simplify the explanation. The package of the microcomputer is of BGA type. The pad electrodes of the microcomputer are connected with soldered bump electrodes (not shown) via WPP lines (re-line layers) provided on the chip surface. The soldered bump electrodes are connected with the ball electrodes The pin functions are allocated to the ball electrodes such that the correlation between the pins and extension lines of the DDR2-SDRAMs 2 and 3 (FIG. 4) and the pad electrode positions on the microcomputer chip (FIGS. 3 and 4) can be maintained as much as possible. An example of this allocation is shown in FIG. 5.

In allocating the pin functions for the ball electrodes, the arrangements of the differential pins are considered. More specifically, the pair of LDQS and LDQSB, the pair of UDQS and UDQSB, and the pair of CK and CKB are allocated to the adjacent ball electrodes on the first and second rounds or to the adjacent ball electrodes on the third and fourth rounds from the outermost round for each pair to form the differential pins. In this example, one line extends between the balls on the PCB, and the line layers are connected using the through holes (THRH) on the PCB. In this structure, the line connected with the ball electrodes on the first round from the outermost round of the ball grid array is extended to the outside as it is, and the line connected with the ball electrodes on the second round passes between the two lines connected with the ball electrodes on the first round and extends to the outside. The respective lines connected with the ball electrodes on the third and fourth rounds pass through line layers different from those of the ball electrodes on the first and second rounds and similarly extend to the outside. According to the typical line structure of this type, the lines connected with the differential pins are disposed adjacent to and opposed to each other on the same line layer when the differential pins are positioned adjacent to each other on the first and second rounds or the third and fourth rounds. Thus, the cancellation of the in-phase noise elements can be easily maintained on the PCB. The pair of CK and CKB are often disposed on the corner and therefore their lines are less densely provided than in other areas. Thus, positioning of the pair of CK and CKLB is not limited to the arrangement of this example.

Figure 6:
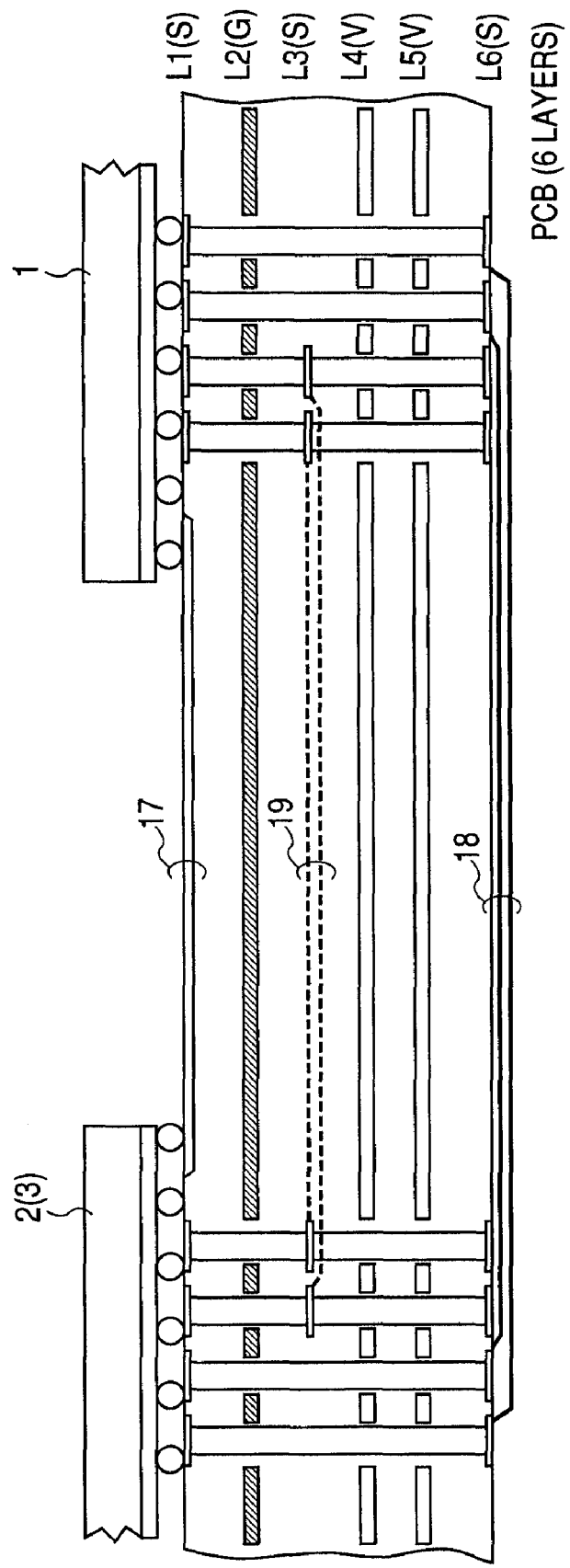
FIG. 6 is a vertical cross-sectional view showing the microcomputer and the DDR2-SDRAM mounted on a PCB.

FIG. 6 is a vertical cross-sectional view of an example of the microcomputer and the DDR2-SDRAM mounted on the PCB. The PCB shown in this figure has 6 layers, but the number of the line layers is not limited to 6. In the figure, surface layer lines 17 and 18 for connecting the microcomputer 1 and the DDR2-SDRAM and an inner layer line 19 for connecting the microcomputer 1 and the DDR2-SDRAM are schematically shown.

Figure 7:
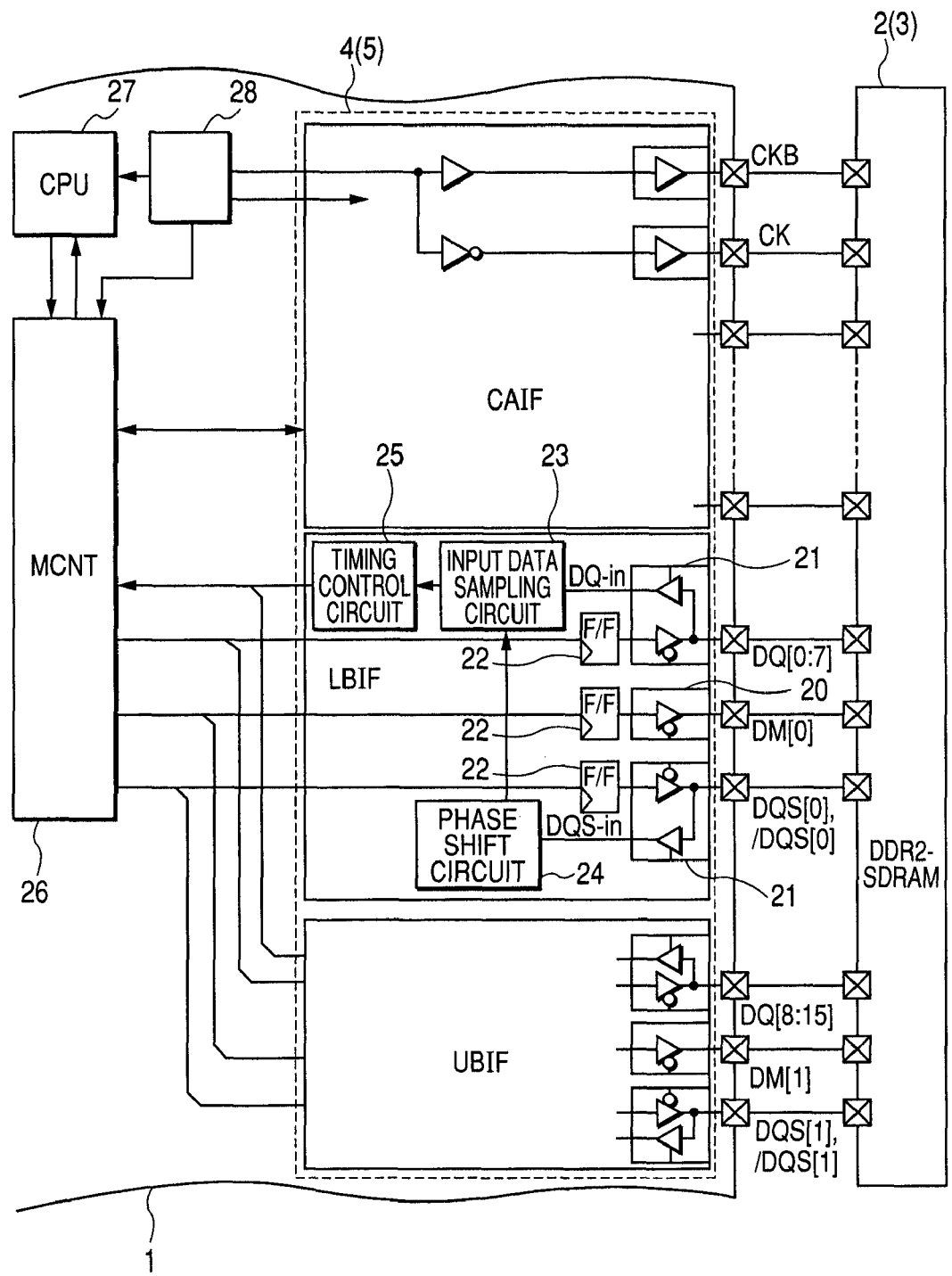
FIG. 7 is a block diagram showing an example of the data units LBIF and UBIF in the memory interface circuit.

FIG. 7 illustrates an example of the data units LBIF and UBIF of the memory interface circuit. Each of the data units LBIF and UBIF has an output buffer 20, an input/output buffer 21, an output latch 22, an input data sampling circuit 23, a phase shift circuit 24 for generating input data sampling signals according to the data strobe signals, and a timing control circuit 25 for controlling transfer timing of sampling data, for example. The data units LBIF and UBIF are connected with a memory controller (MCNT) 26. The memory controller 26 controls memory access based on interface protocols of the DDR2-SDRAMs 2 and 3 in response to memory access requests for the DDR2-SDRAMs 2 and 3 given from a central processing unit (CPU) 27. At the time of the access control by the memory controller 26, the data units LBIF and UBIF provide interface between the memory controller 26 and the DDR2-SDRAMs 2 and 3. A clock pulse generating circuit 28 (CPG) is shown. The function of the memory controller may be provided by a bus state controller.

In this example, the microcomputer which has the semiconductor chip sealed in the BGA-type package is used. However, since the arrangement of the pin functions in the soldered bump electrodes of the chip is basically the same as the arrangement of the pin functions in the ball electrodes of the package, operations and advantages involving technical matters relating to the ball electrode arrangement similar to the operations and advantages provided in the above example can be offered by the microcomputer chip 1A used as a bare chip as it is.

<Multi-Chip Module>

Figure 8:
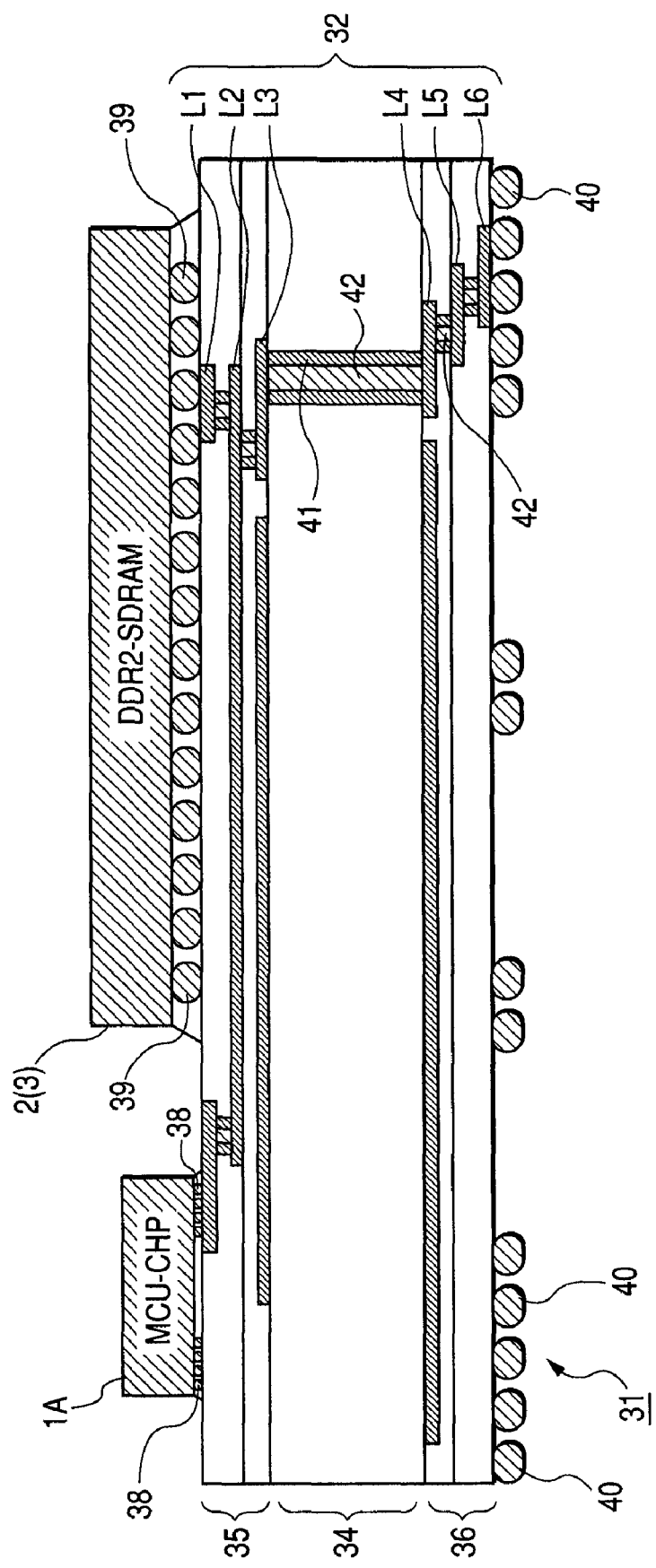
FIG. 8 is a vertical cross-sectional view of a multi-chip module as an example of a semiconductor device according to the invention.

FIG. 8 is a vertical cross-sectional view of an example of a multi-chip module as an example of the semiconductor device according to the invention. A multi-chip module 31 has one microcomputer chip (MCU_CHP) 1A as a data processing device and two DDR2-SDRAMs 2 (3) as a plurality of memory devices on one surface of a module board 32. The clearances between the module board 32 and the microcomputer chip (MCU_CHP) 1A and between the module board 32 and the DDR2-SDRAM 2 (3) are filled with under-fill resin (not shown). The multi-chip module 31 is considered as a microcomputer module of a system-in-package.

The microcomputer chip 1A is a bare chip, and is mounted on the module board 32 with its face looking downward, i.e., with its soldered bump electrodes located at the lower position. The DDR2-SDRAM 2 (3) is sealed in the ball grid array package having the pin arrangement shown in FIG. 2 in conformity with JEDEC STANDARD described above.

The module board 32 has a core layer 34 and build-up layers 35 and 36 formed on the front and back surfaces of the core layer 34, and thus the module board 32 is constituted as a resin board having multiple-layer lines. The core layer 34 has a thickness of about 0.8 mm, for example. The build-up layer 35 has a thickness of about 30-40 µm, for example, and has line layers L3, L2 and L1 from the core layer 34 side. The build-up layer 36 has a thickness of about 30-40 µm, for example, and has line layers L4, L5 and L6 from the core layer 34 side. The line layers L1 and L2 are chiefly used as lines for connecting bump electrodes 38 of the microcomputer chip 1A and ball electrodes 39 of the DDR2-SDRAM 2(3). The line layer L3 is chiefly used for forming a ground plane (ground pattern). The line layer L4 is chiefly used for forming a power supply plane. The line layers L5 and L6 are used as lines for connecting signal lines, the ground plane and the power supply plane provided on the line layers L1 through L4 to module ball electrodes 40 as external connection pins of the module board. In the figure, a through hole 41 is shown as an example of through holes, and penetrates through the core layer 34. A via 42 generically refers to conductive members formed by applying conductive plating to the inner surfaces of via holes or through holes and provides continuity between the upper and lower line layers or metal patterns.

<Address Command Memory Interface>

Figure 9:
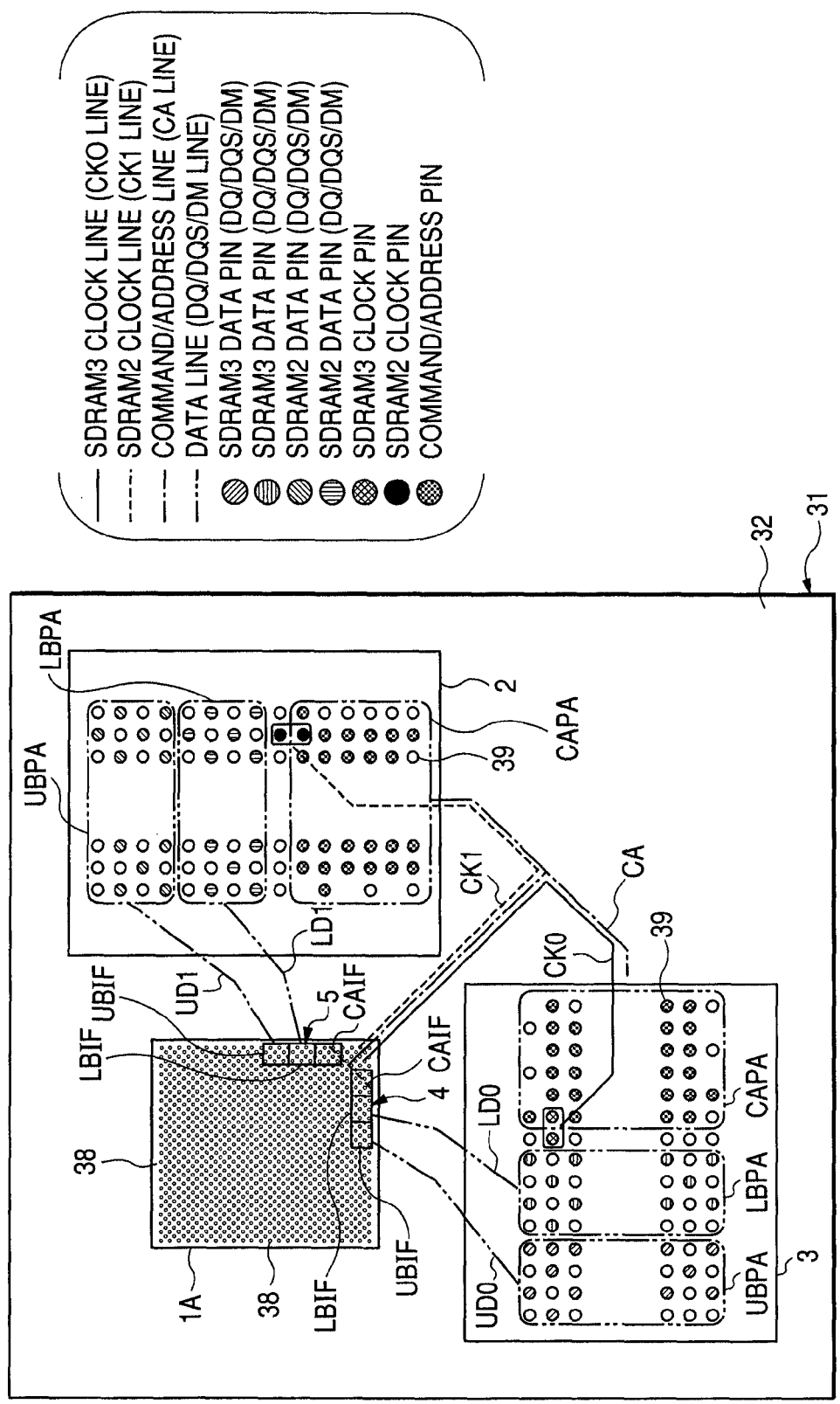
FIG. 9 is a plan view illustrating an example of a plan layout of the multi-chip module shown in FIG. 8.

FIG. 9 is a plan view of a layout example of the multi-chip module 31. The positional relationship between the microcomputer chip 1A and the DDR2-SDRAMs 2 and 3 on the module board 32 is the same as that of the arrangement B shown in FIG. 1. In FIG. 9, the PCB and the microcomputer 1 of the arrangement B are replaced with the module board 32 and the microcomputer chip 1A, respectively. The pin arrangement is equivalent to that of the arrangement B in FIG. 1.

The structures of the memory interface circuits 4 and 5 in the microcomputer chip 1A are similar to those shown in FIG. 3 or other figures. The upper data interface unit UBIF of the memory interface circuit 5 and the upper byte unit pin arrays UBPA of the SDRAM 2 are connected by data line UD1 of the module board 32. The lower data interface unit LBIF of the memory interface circuit 5 and the lower byte unit pin arrays LBPA of the SDRAM 2 are connected by data line LD1 of the module board 32. The upper data interface unit UBIF of the memory interface 4 and the upper byte unit pin arrays UBPA of the SDRAM 3 are connected by data line UD0 of the module board 32. The lower data interface unit LBIF of the memory interface 4 and the lower byte unit pin arrays LBPA of the SDRAM 3 are connected by data line LD0 of the module board 32.

Command and address line CA for connecting the command and address interface unit CAIF of the memory interface circuits 4 and 5 to the corresponding command and address pin arrays of the SDRAMs 2 and 3 passes through the area between the DDR2-SDRAMs 2 and 3 from one corner as a reference position of the microcomputer chip 1A. Then, the route of the command and address line CA is branched at a certain position and the branched parts of the command address line CA reach the corresponding pins of the DDR2-SDRAMs 2 and 3. Since the T-shaped line topology is employed, the lengths of the command and address line routes on the module board 32 are easily equalized.

Differential clock line CK0 supplies differential clock from the memory interface circuit 4 of the microcomputer chip 1A to the clock pins CK and CKB of the SDRAM 3. Similarly, Differential clock line CK1 supplies differential clock from the memory interface circuit 5 of the microcomputer chip 1A to the clock pins CK and CKB of the SDRAM 2. The differential clock lines CK0 and CK1 are disposed along the main route of the command and address line CA. Since the clock signals CLK0 and CK1 specify the timing for receiving the command and address signals, it is preferable to dispose the clock signals CLK0 and CK1 and the command and address signals in parallel for matched timing, i.e., to provide equal topology. In this case, the command and address timing margin can be easily increased.

Figure 10:
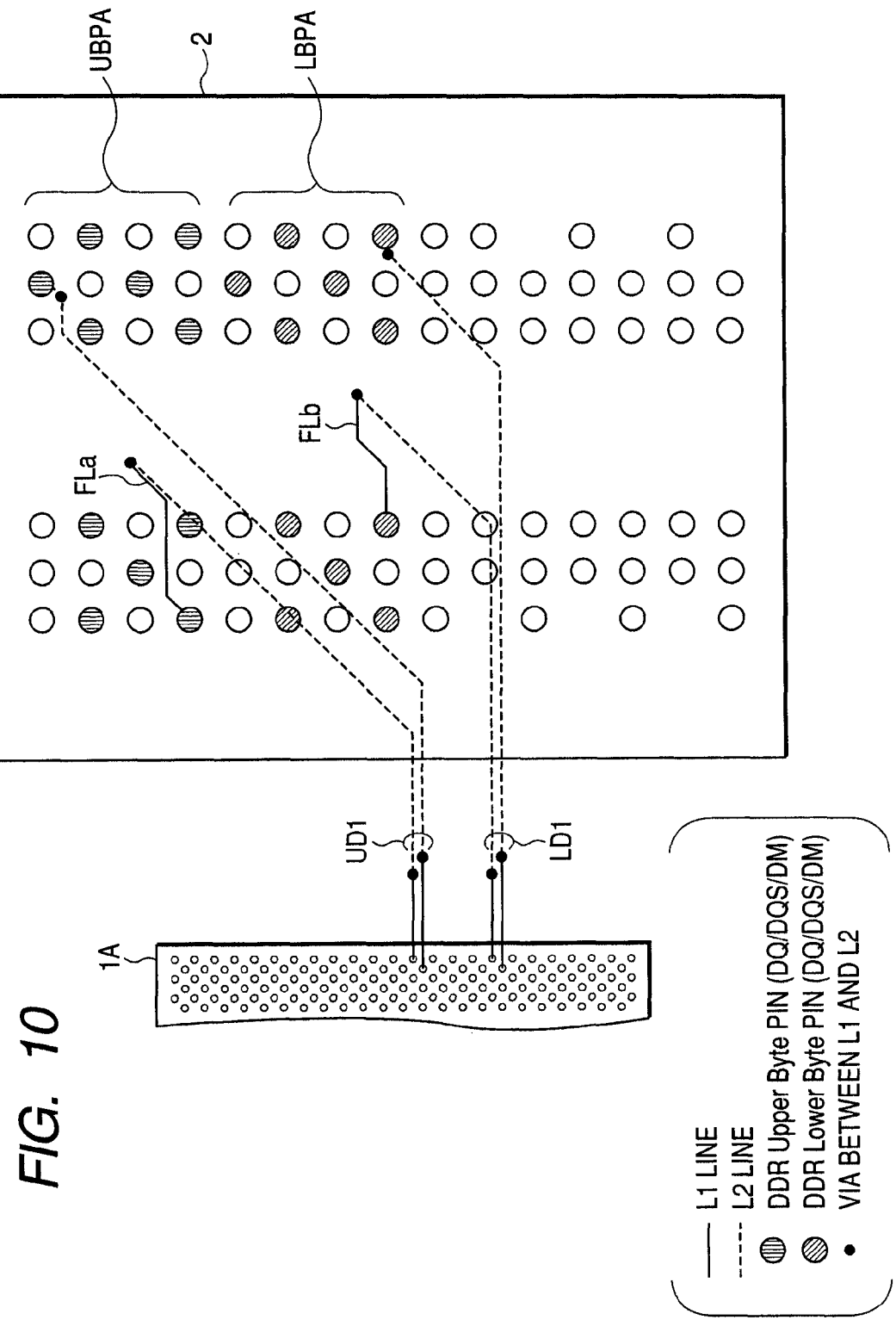
FIG. 10 is a plan view showing an example of data line routes extending to the SDRAM and having equal lengths.
Figure 11:
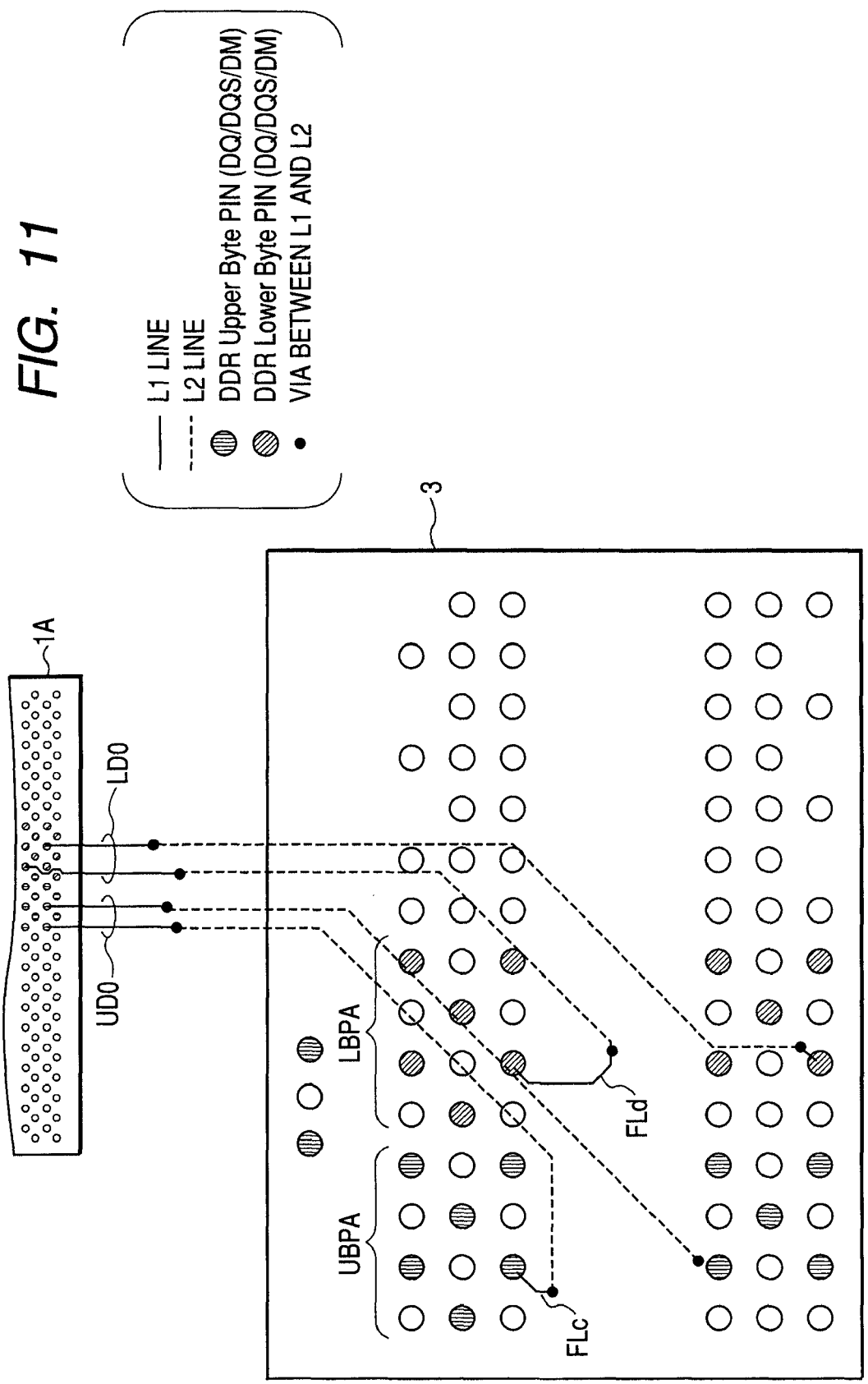
FIG. 11 is a plan view showing another example of data line routes extending to the SDRAM and having equal lengths.

FIG. 10 illustrates an example of the data lines UD1 and LD1 having equalized route lengths. As apparent from FIG. 10, the ball electrodes of the byte unit pin arrays UBPA of the SDRAM 2 are separated from each other in the left-and-right direction. Thus, all the lengths of the lines for the data and data strobe pins within the same byte are made equal to the length of the line provided between the pins having the longest distance therebetween. When the line length is too long for the distance between pins, a part of the corresponding line is folded so as to equalize the line length. Lines FLa and FLb shown in FIG. 10 are examples of the folded routes. By providing the folded routes, the lengths of the data and data strobe signal lines can be easily equalized. The lines between the microcomputer chip 1A and the SDRAM 3 shown in FIG. 11 are similar examples where the line lengths are equalized by a similar method. Lines F1c and F1d shown in FIG. 11 are examples of the folded routes.

Figure 12:
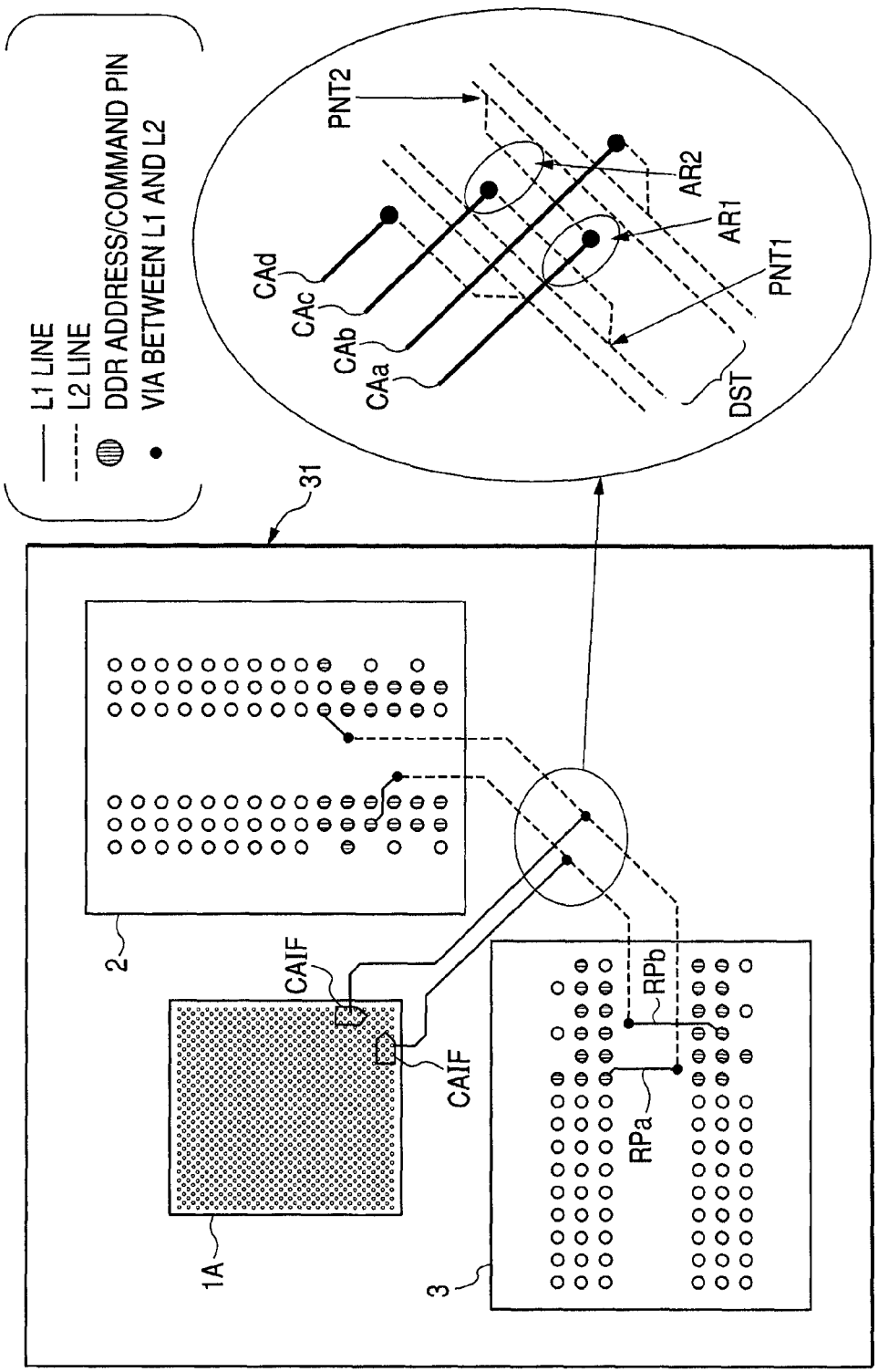
FIG. 12 is a plan view showing an example of command and address line routes extending to the SDRAM and having equal lengths.

FIG. 12 illustrates an example method of equalizing the route lengths of command and address lines CAa through Cad. In the command and address lines of the T-shaped topology, a distance DST is provided between each pair of the lines L2 in the downstream area from the branching point so as to secure sufficient space such as areas AR1 and AR2 through which one via and one line provided between the lines L1 and the lines L2 can pass for each signal, and to make fine adjustment of the branching points in the line layer L2 such as PNT1 and PNT2. In the downstream from the branching point, some different lines of the command and address lines connected to the same DDR2-SDRAM have reverse-direction routes whose transmission direction is reversed such that the route lengths can be equalized. Lines RPa and RPb shown in FIG. 12 are examples of the reverse-direction routes. By providing the reverse-direction routes RPa and RPb, the lengths of the command and address lines can be easily equalized.

Figure 13:
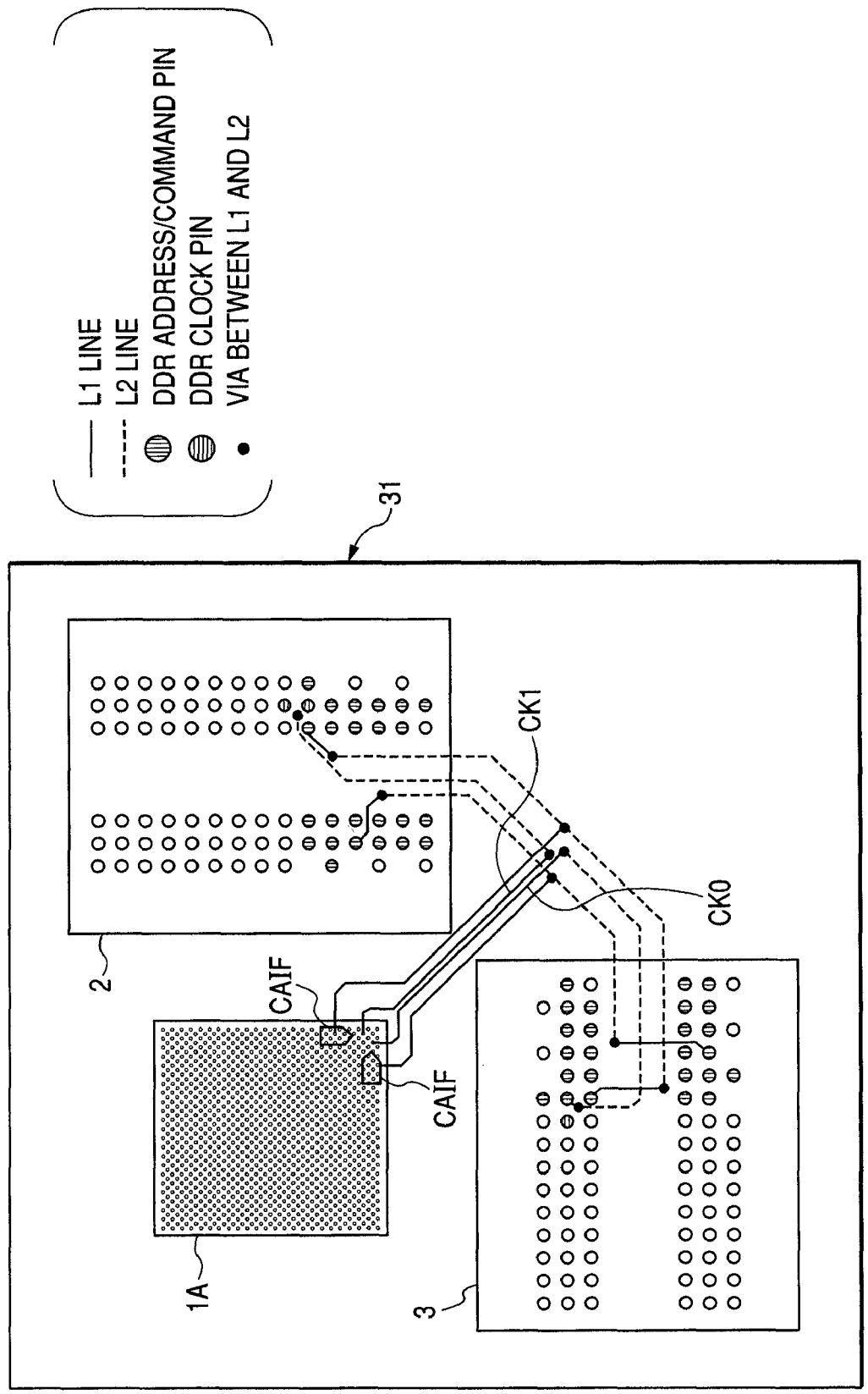
FIG. 13 is a plan view showing an example of clock line routes extending to the SDRAM and having equal lengths.

FIG. 13 illustrates an example method of equalizing the route lengths of the clock lines CK0 and CK1. As discussed above, the clock lines CK0 and CK1 are disposed along the command and address lines of the T-shaped topology. In addition, the clock lines CK0 and CK1 are positioned in the middle of the command and address lines. In this structure, the respective differences between the maximum length and the minimum length of the command and address lines provided between the microcomputer and the SDRAM can be easily equalized. As a result, the timing margin associated with the commands and addresses can be easily secured.

<Differential Signal Ball Electrode Positions>

Figure 14:
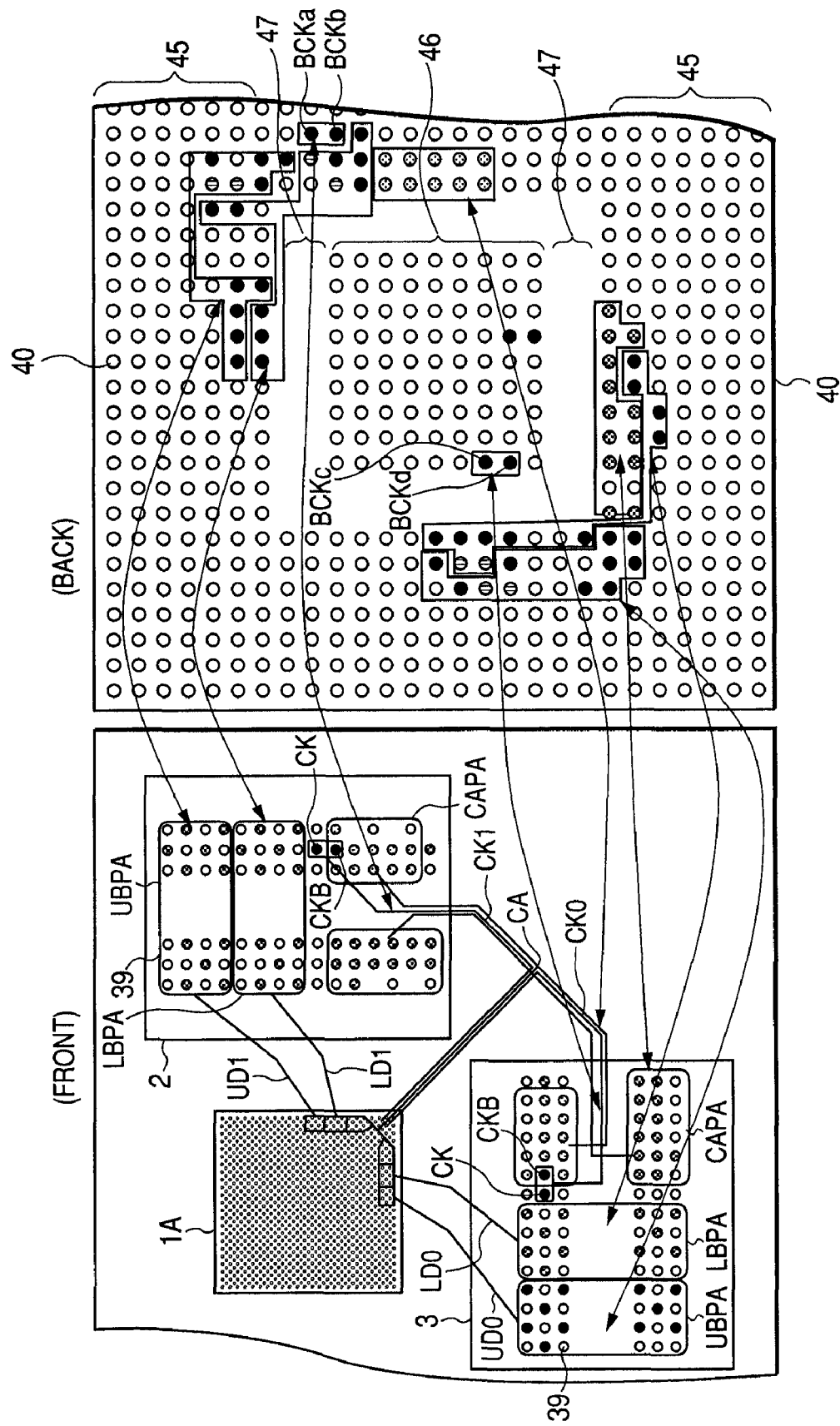
FIG. 14 is a plan view showing an example of an arrangement of pins used exclusively for testing the DDR2-SDRAM.

FIG. 14 shows an example of an arrangement of pins exclusively used for testing the DDR2-SDRAMs 2 and 3. The ball electrodes 40 disposed on the back surface of the module board 32 have a round electrode part 45 where 7 rounds of the ball electrodes 40 are formed along the outer periphery and a central electrode part 46 where 9 lines×9 rows of the ball electrodes 40 are formed in matrix at the center. A blank space 47 is provided between the round electrode part 45 and the central electrode part 46. The multi-chip module 31 has testing ball electrodes, and tests can be executed for the DDR2-SDRAMs 2 and 3 using these testing ball electrodes through external operation independently from the access control by the microcomputer chip 1A. The areas of the test ball electrodes are shown in the figure with arrows indicating the correspondence with the ball electrodes 39 of the DDR2-SDRAMs 2 and 3. As apparent from the figure, the testing ball electrodes are disposed on the inner rounds of the round electrode part. When the multi-chip module 31 is mounted on the mother board (printed circuit board) on which the multi-chip module 31 is to be mounted and the PCB lines are extended from the bottom of the multi-chip module 31 toward the side, the lines can be more easily extended on the mother board as they are disposed closer to the periphery of the multi-chip module 31. Thus, it is preferable that the pins such as the ball electrodes used exclusively for testing which are not required to be connected with the lines on the mother board are collected in the inmost possible area of the module board.

The differential clock line CK1 has a pair of ball electrodes BCKa and BCKb connected with differential terminal resistance and disposed in the vicinity of the clock pins CK and CKB of the SDRAM 2. The ball electrodes BCKa and BCKb are disposed adjacent to each other, and are positioned adjacent to the area where other module pins are not provided or to the module pins exclusively used for testing. Similarly to the differential clock line CK1, the differential clock line CK0 for the SDRAM 3 has a pair of ball electrodes BCKc and BCKd connected with differential terminal resistance. Similarly to the differential clock line CK1, The ball electrodes BCKc and BCKd are disposed adjacent to each other, and are positioned adjacent to the area where other module pins are not provided or to the module pins exclusively used for testing.

Lines to be connected with the module pins used exclusively for testing are not provided on the PCB on which the multi-chip module 31 is mounted. Thus, when the ball electrodes BCKa, BCKb, BCKc, and BCKd connected with differential terminal resistance are disposed adjacent to the area where other module pins are not formed or to the module pins used exclusively for testing, terminal resistance can be directly and easily placed on each of the ball electrodes BCKa, BCKb, BCKc, and BCKd to be connected with differential terminal resistance. In this case, the lengths of the line routes from the branching point to the differential terminal resistance can be extremely reduced and equalized. This structure is effectively applied to differential data strobe signals such as the pair of LDQS and LDQSB and the pair of UDQS and UDQSB. According to JEDEC STANDARD, however, no specific consideration as in the case of the differential clock lines is required for the differential data strobe signals since in-chip terminal resistance produced by ODT (on-die termination) can be used.

FIG. 15 illustrates the details of an example of arrangement areas of the pair of the ball electrodes BCKa and BCKb connected with differential terminal resistance and disposed in the vicinity of the clock pins CK and CKB of the SDRAM2 and a pair of ball electrodes BDQSa and BDQSb connected with differential terminal resistance and disposed in the vicinity of the differential data strobe signals LDQS and LDQSB. The ball electrodes BCKa and BCKb connected with differential terminal resistance are not positioned on the inner periphery of the round electrode part 45. However, since ball electrodes requiring no PCB line extension are formed next to the ball electrodes BCKa and BCKb in the left direction in the figure, a mount area MAR1 for terminal resistance can be securely provided. Additionally, both the ball electrodes BDQSa and BDQSb connected with differential terminal resistance are not positioned on the inner periphery of the round electrode part 45. However, since ball electrodes requiring no PCB line extension are formed next to the ball electrodes BDQSa and BDQSb in the right direction and the blank area 47 is located in the left direction in the figure, a mount area MAR2 for terminal resistance can be easily and securely provided.

<Power Supply Separation>

Operational power supply for the DDR2-SDRAMs 2 and 3 is provided by a set of power supply pins VDDQ and VSSQ for external output and external input/output circuits (for I/O), and a set of power supply pins VDD and VSS for core circuit. The microcomputer chip 1A has the separate sets of power supply pins for the core circuit and the external interface circuit. The microcomputer chip 1A further has a set of power supply pins VCCddr and VSSddr as operational power supply for the interface circuits 4 and 5 interfacing with the SDRAMs 2 and 3. The power supply voltage of the power supply pins VDD, VDDQ, and VCCddr is 1.8V, for example. The ground voltage of the ground pins VSS, VSSQ, and VSSddr is 0V. The power supply set for core circuit in the microcomputer chip 1A is 1.0V and 0V provided by their own power supply pins, and other power supply set for the external interface circuit is 3.3V and 0V provided by their own power supply pins, though not particularly limited to these values.

The operational power supply route for the microcomputer chip 1A is separated from the power supply routes for the DDR2-SDRAMs 2 and 3 on the module board such that tests can be independently executed for the microcomputer chip 1A and the DDR2-SDRAMs 2 and 3. For preventing entrance of power supply noise at the time of DDR2-SDRAM access, the I/O power supply pin VDDQ and the core circuit power supply pin VDD are provided with power supply ball electrodes connected through their own power supply routes electrically separated from each other. Ball electrodes connected with VSS, VSSQ and VSSddr are not electrically separated such that electrical standard can be stabilized with sufficient ESD resistance.

Figure 16:
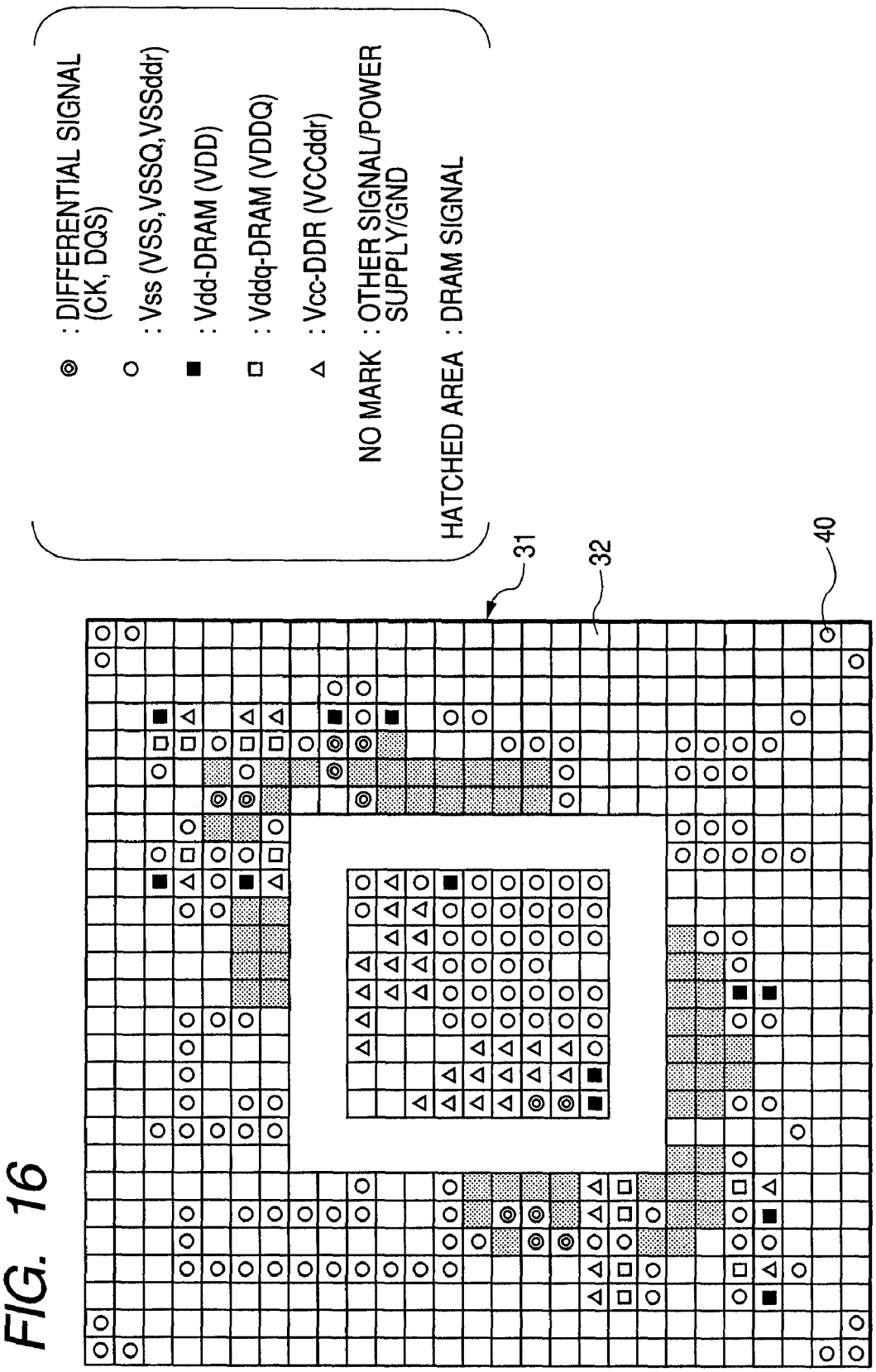
FIG. 16 is a plan view showing an example of an arrangement of power supply ball electrodes on a module board.

FIG. 16 illustrates an arrangement example of power supply ball electrodes on the module board. Shown in the figure are power supply ball electrode Vdd-DRAM allocated to the power supply pin VDD of the SDRAMs 2 and 3, power supply ball electrode Vddq-DRAM allocated to the power supply pin VDDQ of the SDRAMs 2 and 3, power supply ball electrode Vcc-DDR allocated to the power supply pin VCCddr of the microcomputer chip 1A, and ground ball electrode Vss allocated to VSS, VSSQ, and VSSddr.

Figure 17:
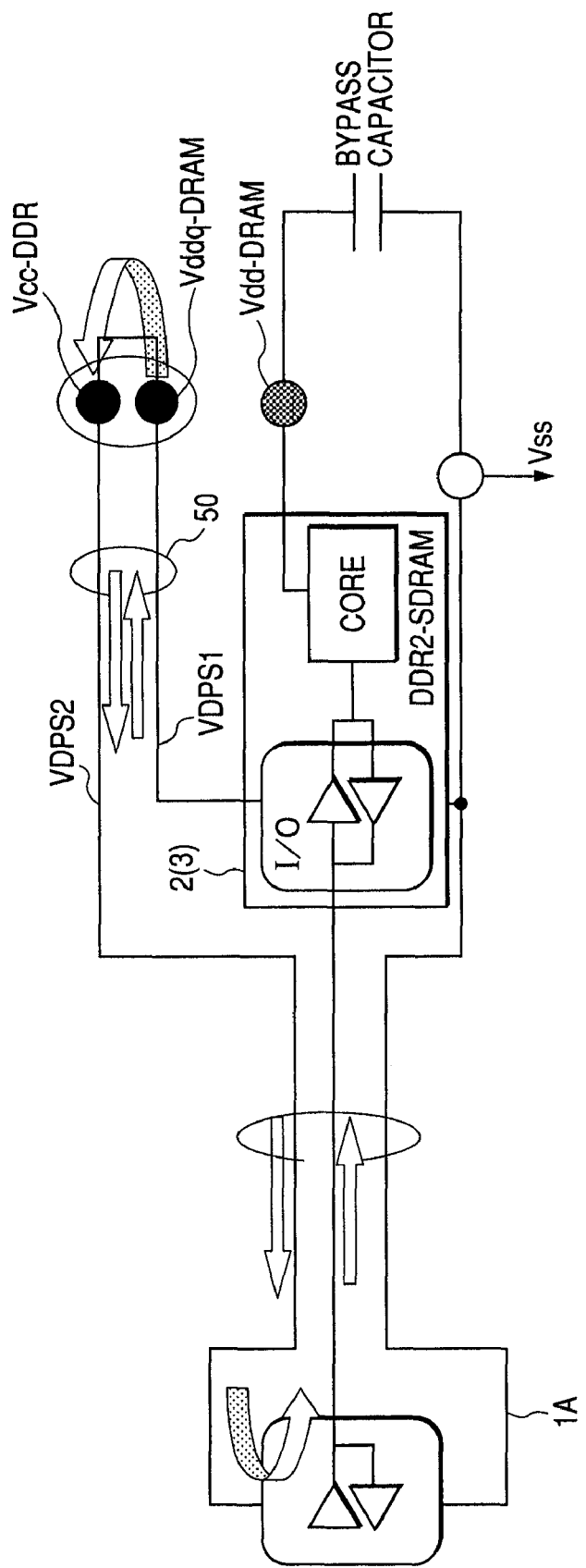
FIG. 17 schematically shows a return current route of power supply pins produced by changes of signals outputted from MCU-CHP to the DDR-SDRAM.

FIG. 17 schematically shows a power supply return current route generated by change of signals outputted from the MCU-CHP 1A to the DDR-SDRAM2. When Vcc-DDR is separated from Vddq-DRAM and signals are charged or discharged between the MCU-CHP 1A and the DDR2-SDRAM 2, return current routes VDPS1 and VDPS2 flowing through the power supply line in the charge and discharge current are separated from each other by the Vddq-DRAM and Vcc-DDR on the module board 32, and are returned via the power supply line or the power supply plane on the mother board. In this condition, power supply impedance increases. For preventing occurrence of this situation as much as possible, the Vcc-DDR is disposed close to the Vddq-DRAM. In this structure, as shown by 50 current flowing through the Vcc-DDR and current flowing through the Vddq-DRAM in the reverse direction are coupled, and thus effective inductance can be reduced.

<Plural Feeding Vias to Memory Core>

Figure 18:
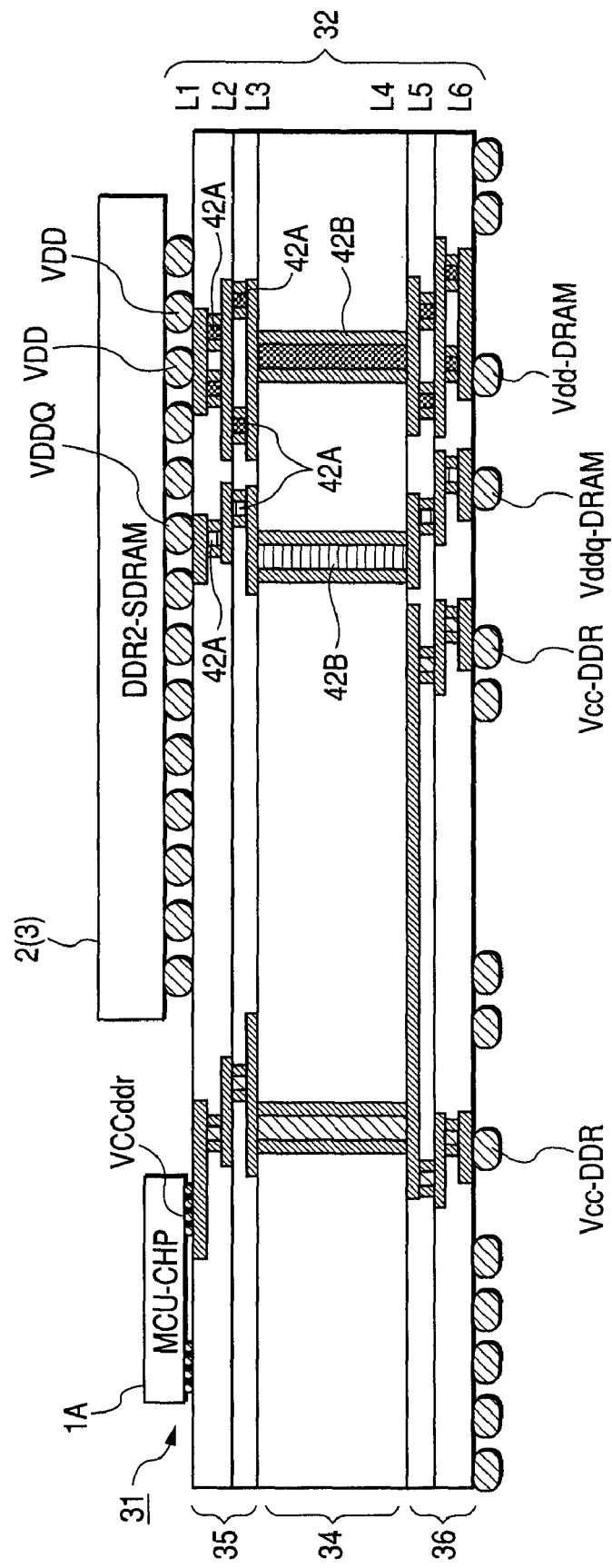
FIG. 18 is a vertical cross-sectional view illustrating a structure of the multi-chip module, showing main power supply pines.

FIG. 18 is a vertical cross-sectional view of a structure example of the multi-chip module 31, showing the main power supply pins. In the DDR2-SDRAMs 2 and 3, the power consumption of the core circuit is larger than that of the I/O circuit, considering that relatively large power is consumed at the time of refresh operation. The feed area of one via 42A formed in the build-up layers 35 and 36 is smaller than the feed area of one via 42B formed in the core layer 34. The number of the vias 42A formed in each of the build-up layers is two for one via 42B in the core layer 34 in the feed route connecting the Vdd-DRAM to the VDD. The number of the vias 42A formed in each of the build-up layers 35 and 36 is one for one via 42B in the core layer 34 in the feed route connecting the Vddq-DRAM to the VDDQ. This structure prevents insufficiency in current supply capability by the smaller conductive area of the via in the build-up layer than the conductive area of the via in the core layer when the power consumption of the core circuit in the memory device is larger than the power consumption of the I/O circuit.

<Noise Reduction by Ground Slit>

Figure 19:
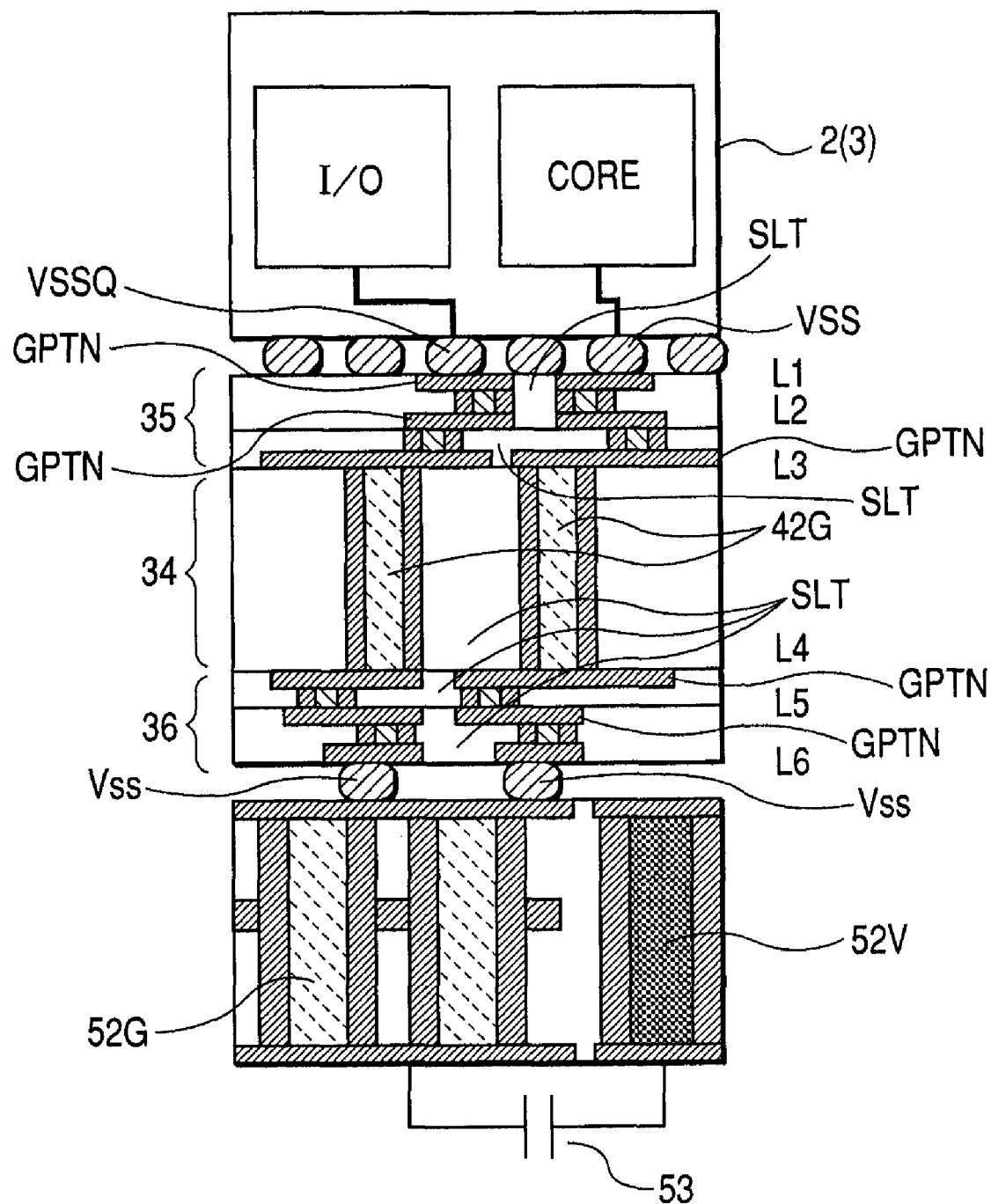
FIG. 19 is a vertical cross-sectional view illustrating a structure of routes connecting ground pins and ground ball electrodes.
Figure 20:
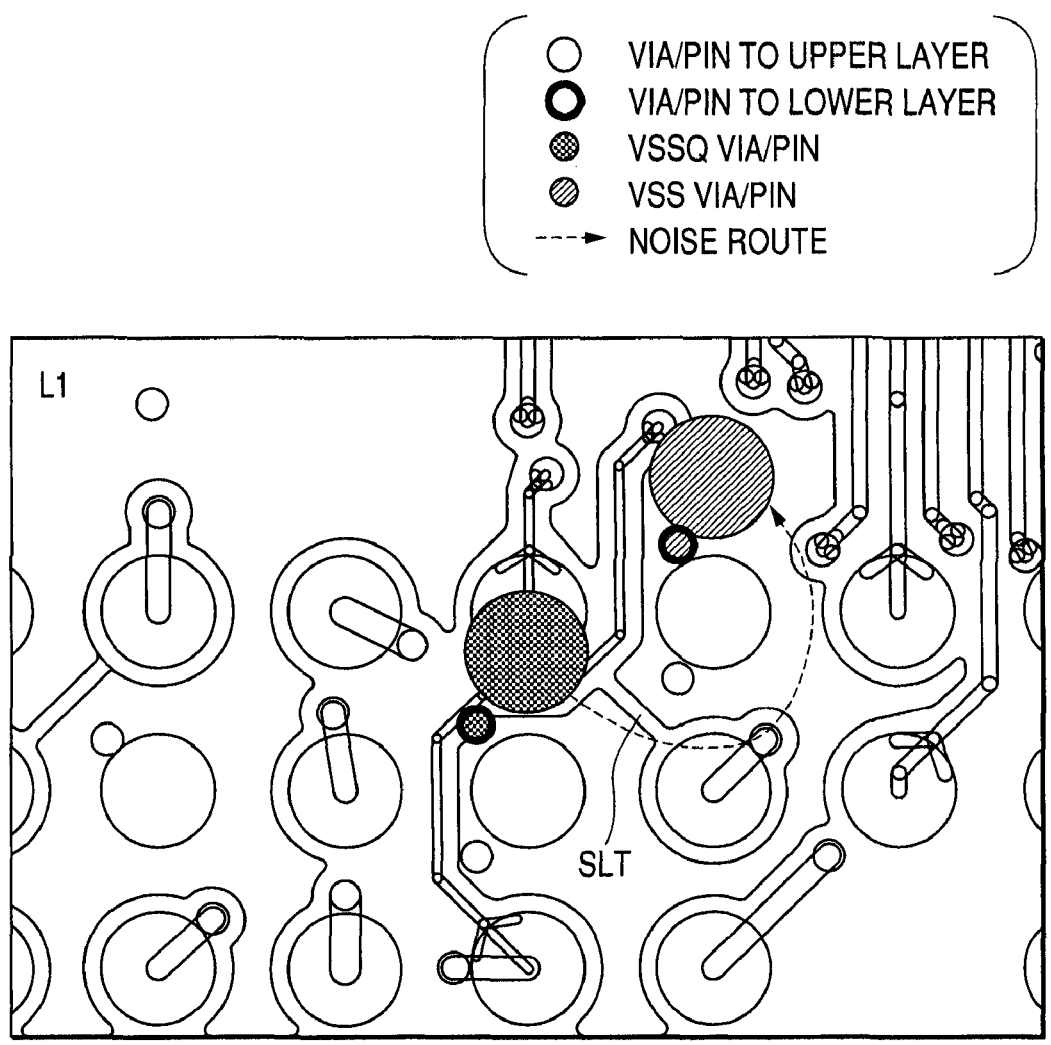
FIG. 20 is a plan view showing an example of a slit on a ground pattern provided in an L1 line layer of the module board.
Figure 21:
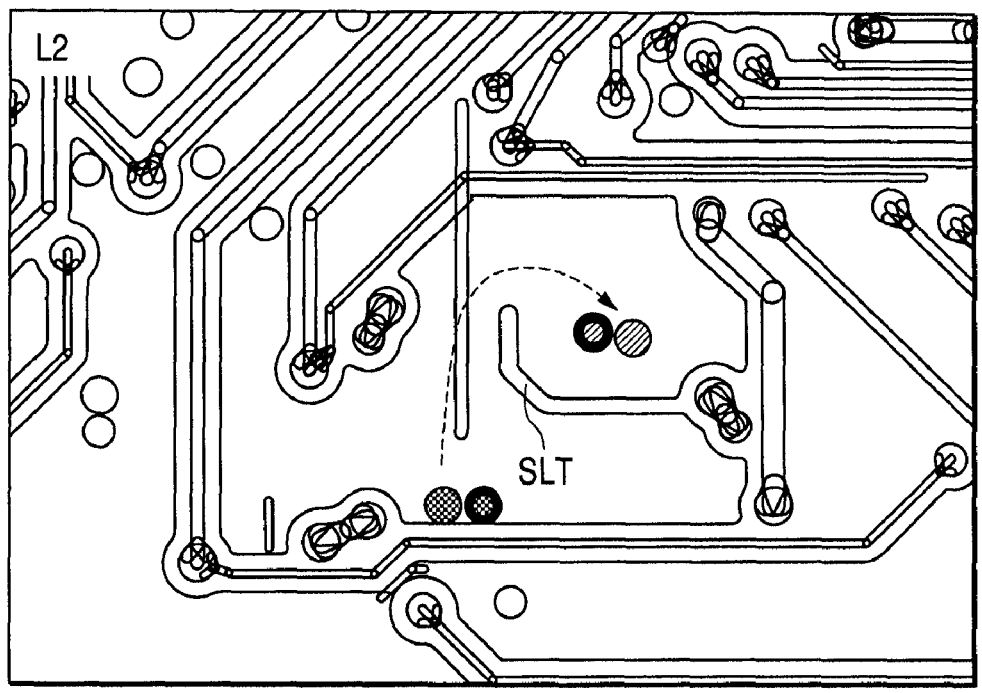
FIG. 21 is a plan view showing an example of a slit on a ground pattern provided in an L2 line layer of the module board.
Figure 22:
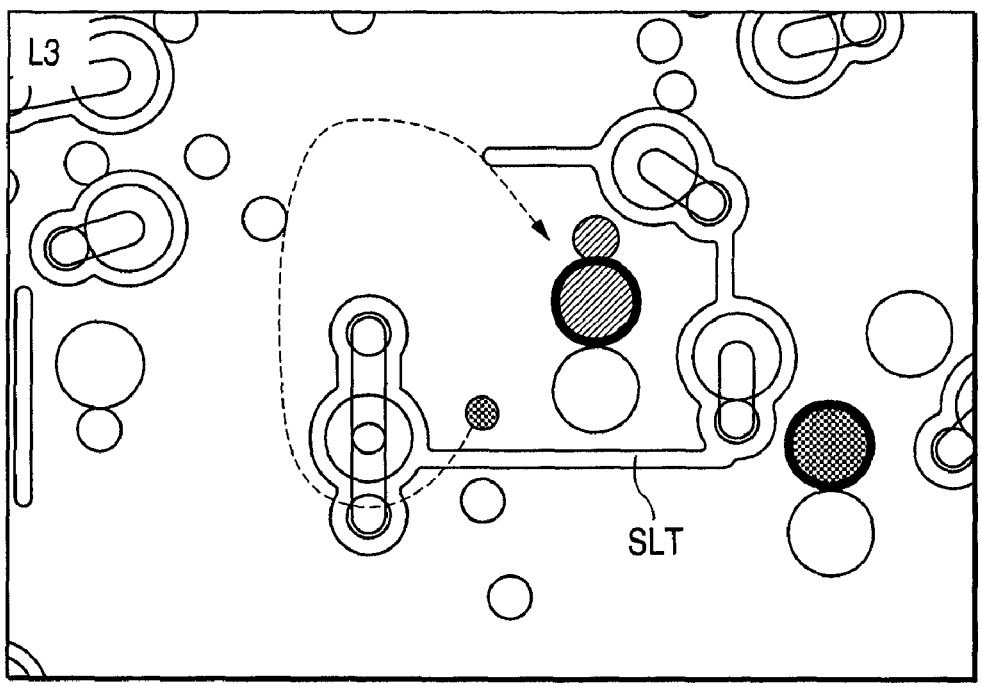
FIG. 22 is a plan view showing an example of a slit on a ground pattern provided in an L3 line layer of the module board.
Figure 23:
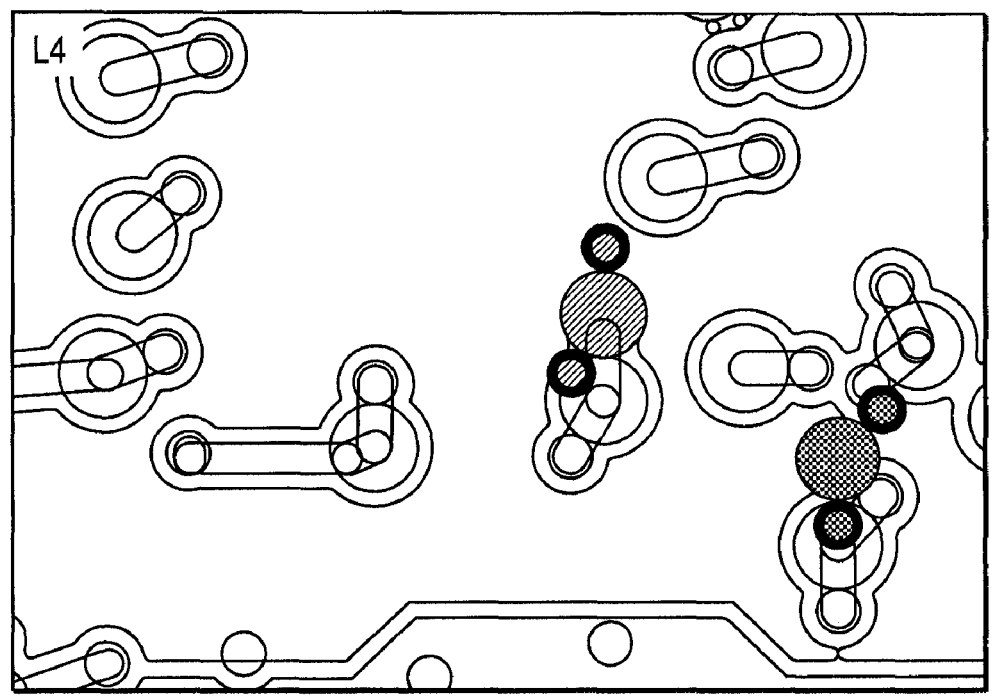
FIG. 23 is a plan view showing an example of a slit on a ground pattern provided in an L4 line layer of the module board.
Figure 24:
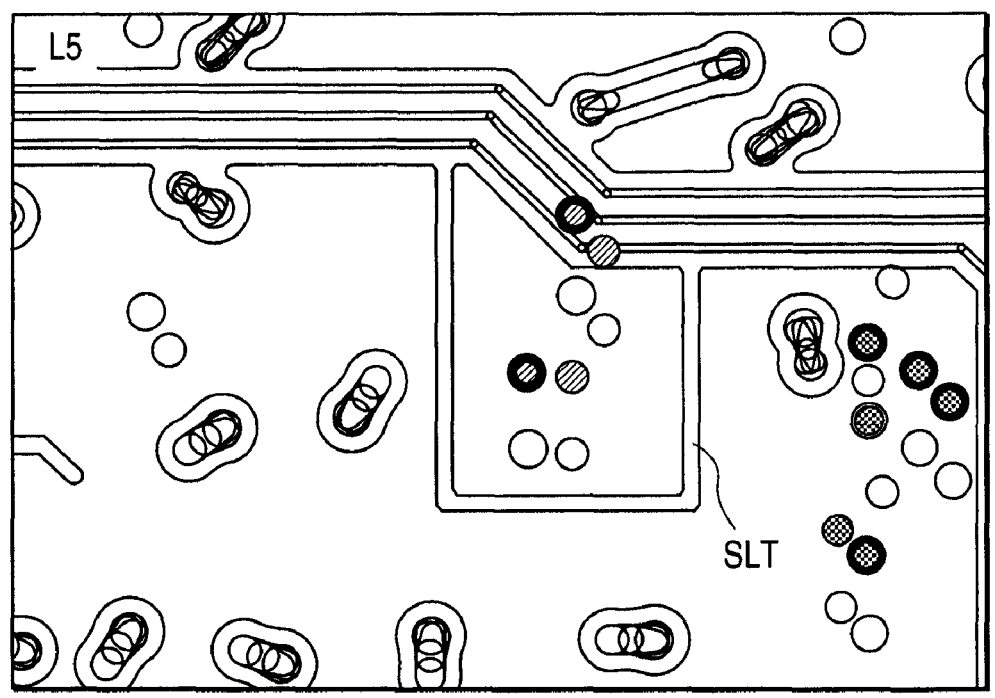
FIG. 24 is a plan view showing an example of a slit on a ground pattern provided in an L5 line layer of the module board.
Figure 25:
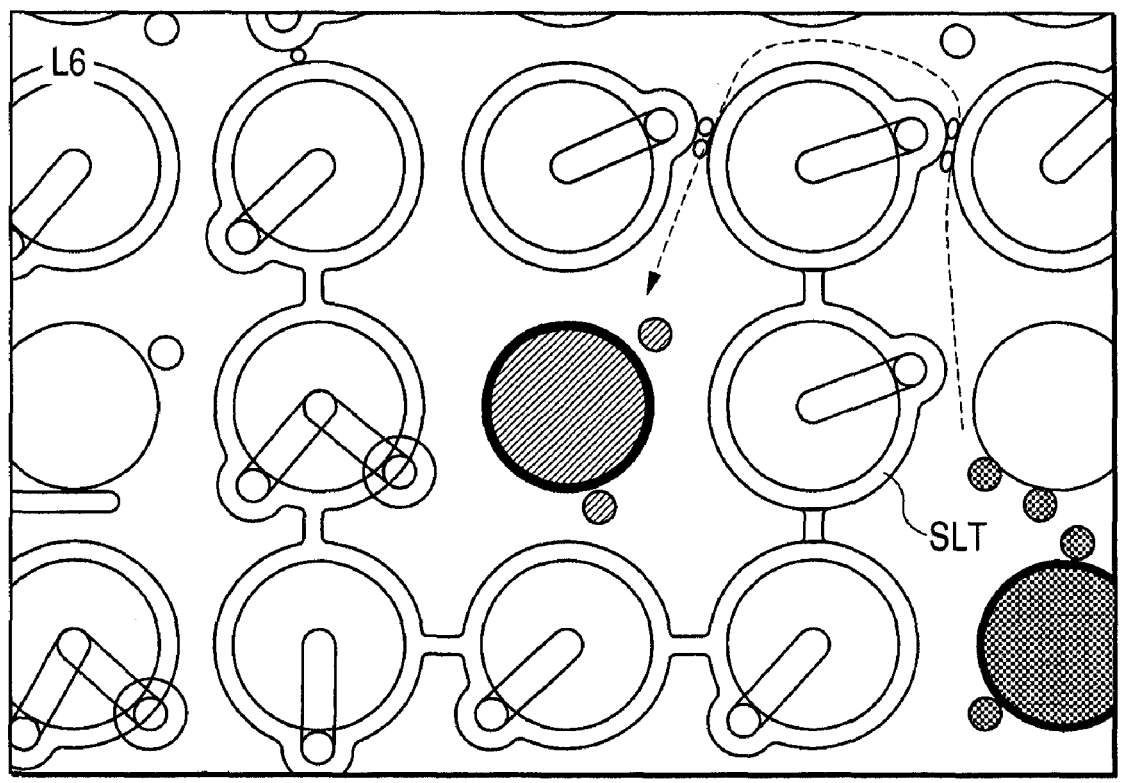
FIG. 25 is a plan view showing an example of a slit on a ground pattern provided in an L6 line layer of the module board.

FIG. 19 is a vertical cross-sectional view of a structure example of routes connecting the ground pins VSS and VSSQ and the ground ball electrodes Vss. As discussed above, the ground pins VSS and VSSQ separated from each other on the device are electrically connected with continuity therebetween within the module board, and are connected to the ground ball electrodes Vss as electrically common electrodes. The core layer and the build-up layers have a ground pattern GPTN connected to the ground pins VSS and VSSQ and the ground ball electrodes Vss with continuity so as to increase the area and stabilize the ground voltage as much as possible. More specifically, since the ground pins VSS and VSSQ and the ground ball electrodes Vss are electrically unified with the ground pattern GPTN of the core layer and the build-up layers without separation which is seen in the case of the power supply pins, problems such as deterioration of ESD (electrostatic discharge) resistance, deterioration of electric properties due to hindrance to the return path route, and difference in the ground levels are not easily caused. When the ground DC is common for all parts, there is a possibility of noise entrance between the different ground pins VSS and VSSQ. On the other hand, the ground pattern GPTN has a slit SLT between the line segment connecting the pad or via joined to the device ground pin VSS and the pad or via joined to the device ground pin VSSQ. FIGS. 20 through 25 show examples of the conditions of the line layers L1 through L6. The line layer L4 does not have the ground pattern since it is basically used for the power supply plane.

The slit SLT elongates the routes providing electrical continuity between the different ground vias and pads on the ground pattern GPTN. That is, the routes providing electrical continuity between different ground pins are extended on the plane of the ground pattern GPTN. As a result, AC noise is easily introduced to the route providing electrical continuity in the longitudinal direction to a bypass capacitor 53 provided between a ground via 52G and a power supply via 52V on the mount board. Thus, entrance of ground noise to different ground pins can be reduced or mitigated.

Figure 26:
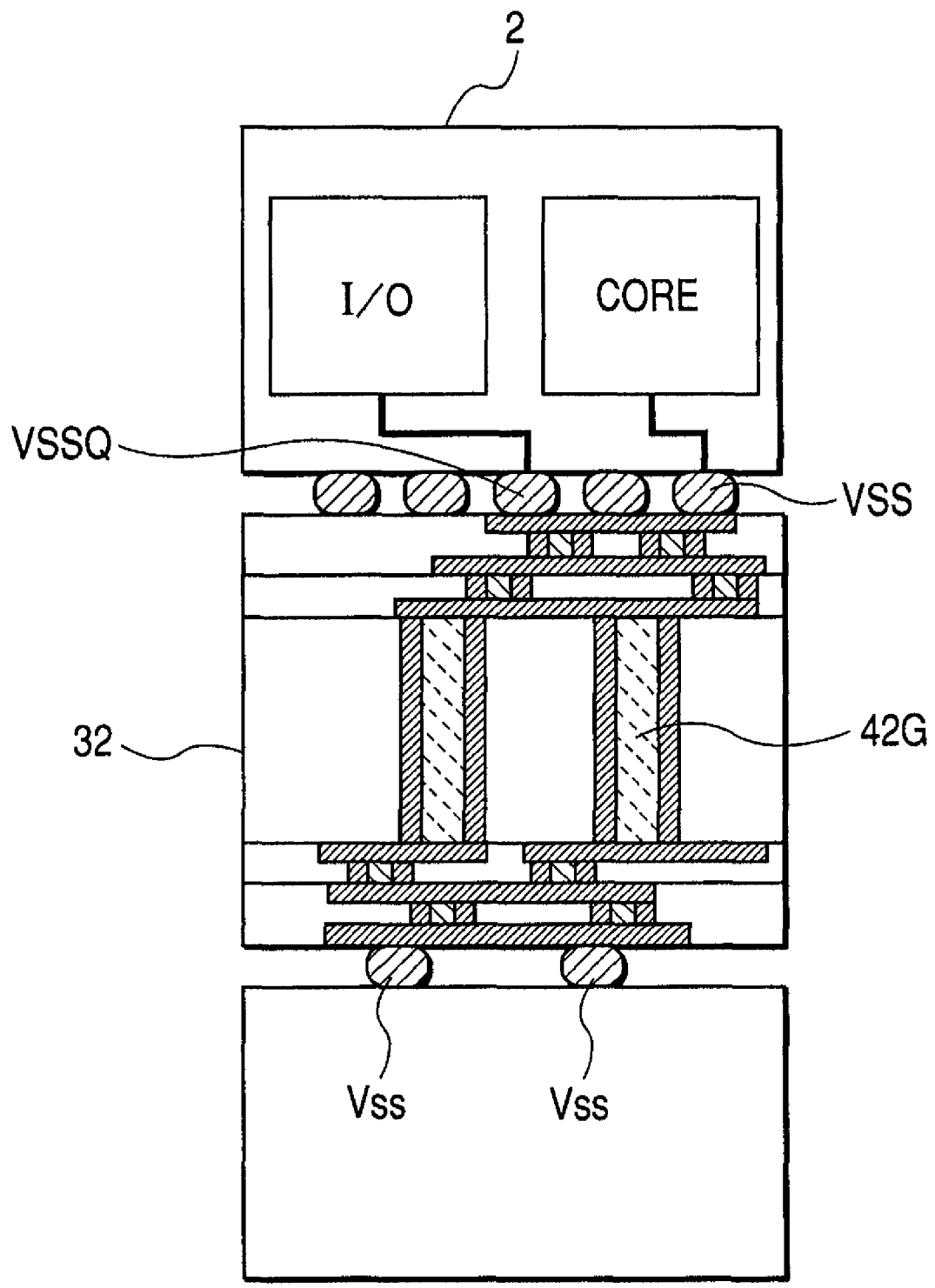
FIG. 26 is a cross-sectional view showing a comparison example in which no slit is formed on a ground plane.

FIG. 26 shows a comparison example in which the slit SLT is not provided. In this case, entrance of different power supply into VSS and VSSQ is caused through the ground pattern GPTN of the layer L1.

Figure 27:
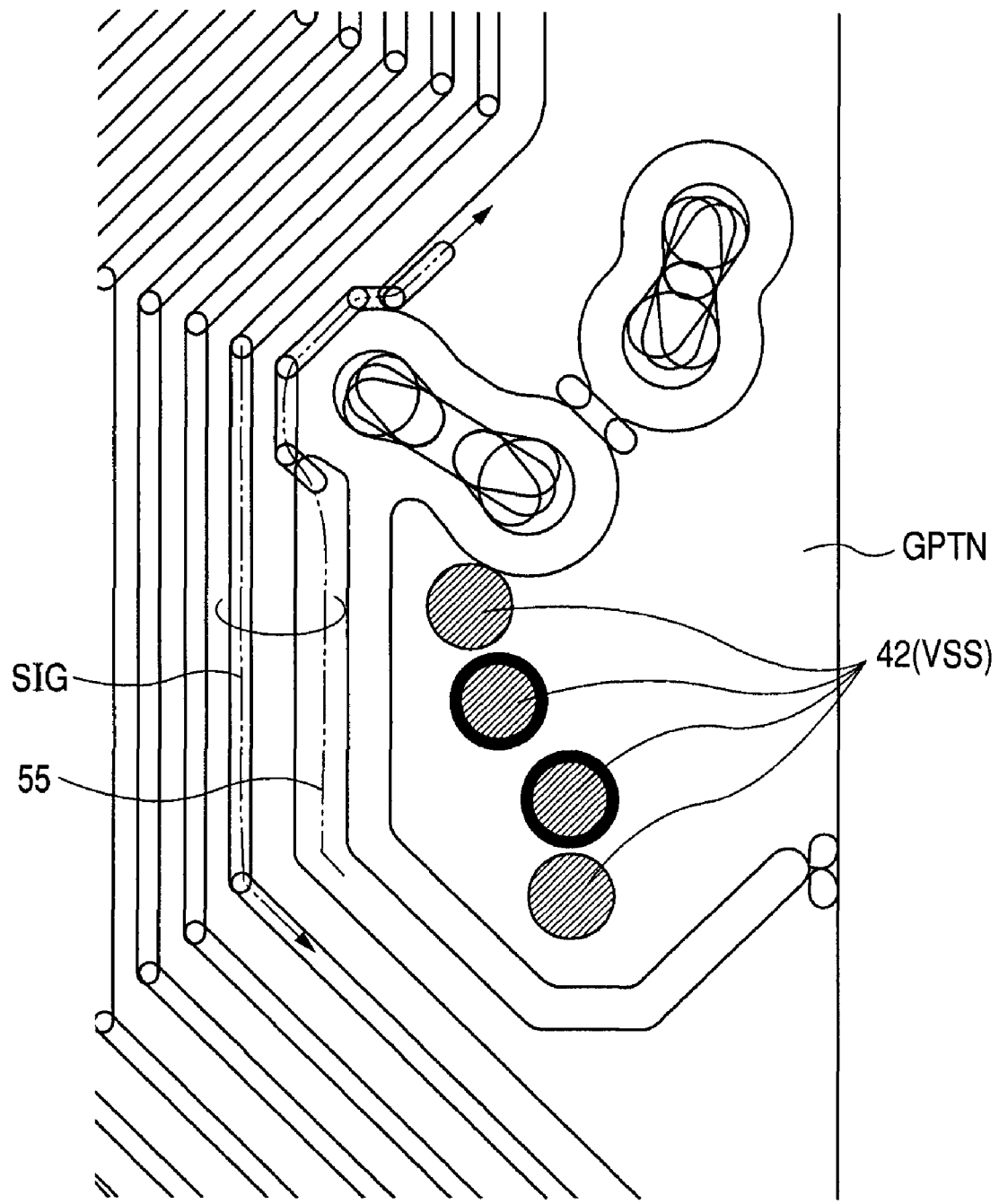
FIG. 27 is a plan view showing a structure example where a slit is formed on a periphery of a ground plane used as a guard for a signal line.

FIG. 27 shows an example in which a slit is formed on the periphery of the ground plane used as a guard for a signal line. When attention is paid for the via 42G (VSS) ground plane GPTN connected with the ground pin VSS and a periphery 55 of the ground plane GPTN is used as a ground guard opposed to a signal line SIG, the slit SLT is formed between the periphery 55 of the ground plane and the via 42G (VSS). Return current flows in the periphery 55 of the ground plane used as the guard for the signal line in parallel with the signal line SIG. The slit SLT secures a-return path in the periphery 55 adjacent to the signal line SIG, and prevents entrance of current flowing in the return path to the ground pin VSS of the device 2 as noise. The via and pad which should be appropriately equipped so that the slit can be formed may be those connected with VSSQ.

Obviously, many modifications and variations of the present invention are possible in the light of teachings shown in the above examples. It is therefore to be understood that the invention may be practiced otherwise than as specifically described herein without departing from the scope of the invention.

For example, the parallel data input/output bit number of the DDR2-SDRAM may be ×8 or other numbers. The microcomputer is not limited to a general-purpose controller, but may be a graphic controller, a controller for encoding and decoding, or other controllers.

What is claimed is:

1. A microcomputer, comprising:
   a semiconductor board having a surface comprised of a rectangle in a plan view;
   a first memory interface circuit formed on the surface of the semiconductor board; and
   a second memory interface circuit formed on the surface of the semiconductor board;
   wherein the first memory interface circuit is extended along a first side of the semiconductor board in plan view;
   wherein the second memory interface circuit is extended along a second side of the semiconductor board in the plan view;
   wherein the first and second sides are adjacent to each other via a corner; and
   wherein both the first and second sides have the same data units associated with data and data strobe signals.

2. A microcomputer according to claim 1, wherein the data units have bytes as the units of data.

3. A microcomputer according to claim 2, wherein the data units have seven data input/output circuits, a data mask signal circuit, an inversion data strobe signal circuit, a non-inversion data strobe signal circuit, and a data input/output circuit in this order from the corner as the reference position.

4. A microcomputer according to claim 2, wherein the data units have plural units disposed in series.

5. A microcomputer according to claim 3, further comprising:
   a package on which the semiconductor board is mounted, the package having a ball grid array structure for external connection pins, wherein:
   an external connection pin connected with the inversion data strobe signal circuit and an external connection pin connected with the non-inversion data strobe signal circuit are disposed adjacent to each other on the first round and the second round or on the third round or fourth round, respectively, from the outermost position of the ball grid array so as to constitute differential pins.

6. A microcomputer according to claim 1, wherein DDR2-SDRAMs having a pin arrangement in conformity with JEDEC STANDARD are connectable to the first and second memory interface circuits.

7. A microcomputer according to claim 1, further including:
   command and address units associated with address signals and commands, wherein
   the command and address units are disposed in series with the data units; and
   the positions of the command and address units are closer to the corner as the reference position of the semiconductor board than the positions of the data units.

8. A microcomputer according to claim 1, further including:
   DDR2-SDRAMs having a pin arrangement in conformity with JEDEC STANDARD are connectable to the first and second memory interface circuits, wherein
   the first and second memory interface circuits have an arrangement of interface functions corresponding to data pin arrays associated with data and data strobe signals and command and address pin arrays associated with address signals and commands on the longer side of the DDR2-SDRAM.

* * * * *